United States Patent
Ozawa et al.

(10) Patent No.: US 8,102,234 B2
(45) Date of Patent: Jan. 24, 2012

(54) LAYERED INDUCTOR

(75) Inventors: Shuichi Ozawa, Nagoya (JP); Natsumi Shimogawa, Nagoya (JP); Katsuyuki Takeuchi, Aisai (JP); Yukio Aisaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 50 days.

(21) Appl. No.: 12/691,950

(22) Filed: Jan. 22, 2010

(65) Prior Publication Data

US 2010/0194513 A1    Aug. 5, 2010

Related U.S. Application Data

(60) Provisional application No. 61/158,023, filed on Mar. 6, 2009.

(30) Foreign Application Priority Data

Jan. 22, 2009 (JP) .................................... 2009-12078
Jan. 21, 2010 (JP) .................................... 2010-11311

(51) Int. Cl.
*H01F 5/00* (2006.01)

(52) U.S. Cl. ........................ 336/200; 336/223; 336/232

(58) Field of Classification Search .................. 336/200, 336/223, 232
See application file for complete search history.

(56) References Cited

U.S. PATENT DOCUMENTS

| 7,498,919 B2 * | 3/2009 | Fujiwara et al. | 336/200 |
| 2006/0001520 A1 * | 1/2006 | Kaji et al. | 336/223 |
| 2006/0216484 A1 * | 9/2006 | Saita et al. | 428/209 |
| 2009/0045905 A1 * | 2/2009 | Nakagawa et al. | 336/232 |

FOREIGN PATENT DOCUMENTS

| JP | 2987176 | 10/1999 |
| JP | 4020131 | 10/2007 |

* cited by examiner

*Primary Examiner* — Anh Mai
(74) *Attorney, Agent, or Firm* — Burr & Brown

(57) ABSTRACT

A layered inductor is manufactured by layering "silver-based conductive layers" and "ferrite-based magnetic layers" and simultaneously firing these layers. The conductive layers are via-connected to form a helical coil. A shape of a cross sectional surface of the conductive layer, cut by a plane perpendicular to a longitudinal direction of each of the conductive layers is a substantial trapezoid shape, having an upper base and a lower base. A base angle θ of the trapezoid shape at both ends of the lower base is equal to or greater than 50° and is smaller than or equal to 80°.

20 Claims, 23 Drawing Sheets

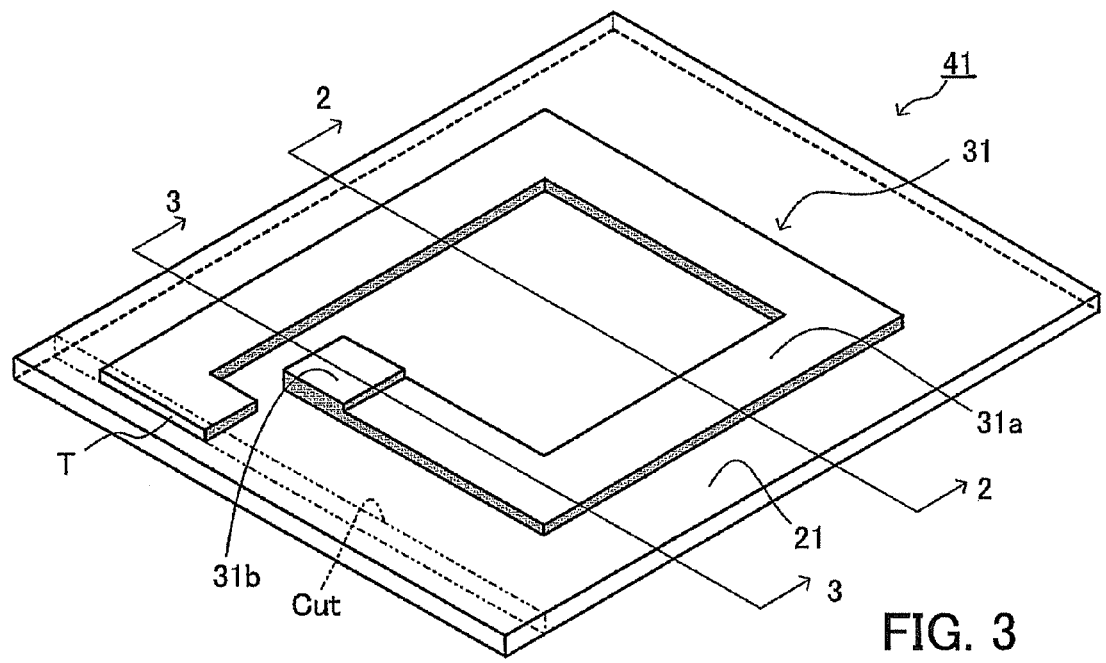
FIG. 3
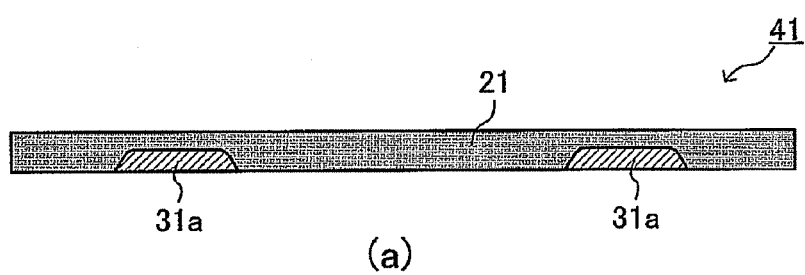
(a)
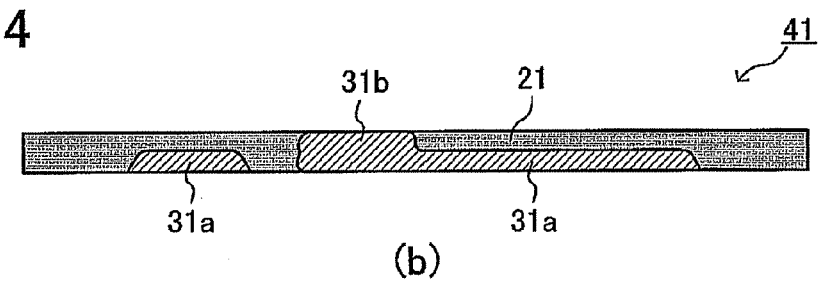
(b)
FIG. 4 exapmple 1-5    200 μm exapmple 1-5    100 μm exapmple2-3    200 μm exapmple2-3    100 μm

LAYERED INDUCTOR

FIELD OF THE INVENTION

The present invention relates to a layered inductor in which silver-based conductive layers and ferrite-based magnetic layers are layered, and simultaneously fired/sintered.

BACKGROUND OF THE INVENTION

Conventionally, a compact power inductor (chip inductor) has been used for realizing functions such as suppressing noise, rectification, and smoothing signals, for example, in a power supply circuit for semiconductors, a power circuit for a DC-DC convertor, and so on. A large inductance and a low resistance are required for the compact power inductor.

One of the compact power inductors is a layered inductor (multi-layered inductor). As shown in FIG. 36, which is a perspective view of the layered inductor 110, the layered inductor 110 typically comprises a magnetic body 111 and a coil 112 buried in the magnetic body 111.

The coil 112 comprises conductive layers (conductive thin plates) 112A, each of which is formed so as to have a predetermined shape, and conductive connecting portions 112B in via holes (VIA), each of which electrically via-connects (wiring-connects between layers) between the conductive layers adjacent to each other in a direction of layering (in a vertical direction), and is formed to have a helical shape. This type of layered inductor 110 is manufactured, for example, by printing and layering method, tape layering method, and the like.

In order to lower a resistance in such a layered inductor 110, it is necessary to increase a cross sectional area of the coil 112. However, as shown in FIG. 37, according to the printing and layering method, the tape layering method, or the like, magnetic-layers-before-fired 111a are firstly prepared and a conductive-layer-before-fired 112a is formed on each of the magnetic layers 111a. Subsequently, as shown in FIG. 38, they are layered/laminated to form a layered body, and thereafter, the layered body is fired (burnt/sintered). Accordingly, as shown in FIG. 38, thickening the conductive layer 112a in order to increase the cross sectional area of the coil 112 leads to a large difference between a thickness X1 of a portion where the conductive layers 112a are formed and a thickness X2 of a portion where no conductive layer 112a is formed.

As a result, when the layered body is fired, a gap (a crack) may be generated/occurred between the magnetic layers 111a, 111a adjacent to each other in the direction of layering, and in some cases, a problem that a structural defect may occur arises, e.g., one of the magnetic layers 111a is delaminated (or removed) from another layer 111a adjacent to the one (i.e., a delamination occurs). Further, there may be another problem that the inductor does not have desired electrical characteristics, such as a great decrease in the inductance, due to the structural defect.

In order to cope with the problems, it is proposed that gaps around the conductive layers 112a are formed beforehand (refer to, for example, Patent document 1 and Patent document 2). However, it is necessary to increase a cross sectional area of the gap as the cross sectional area of the conductive layer 112a increases. As a result, it is still difficult to decrease the resistance of the inductor without an excessive decrease of the inductance of the inductor, even by the proposed technique.

Patent Document 1: Japanese Patent No. 2987176
Patent Document 21: Japanese Patent No. 4020131

SUMMARY OF THE INVENTION

Meanwhile, a gel cast method (gel-casting method) is a method where a ceramic slurry in which ceramic powders and gelatinizing agents are dispersed in the dispersion media (solvent) is poured into a mold, and thereafter, the slurry is fixed/hardened according to an urethane reaction so as to obtain a formed-compact-before-fired (pre-sintered body, pre-fired body). According to the gel cast method, a formed compact having a desired shape to be formed by the mold can easily be obtained, because an amount of shrinkage of the slurry when the slurry is dried (or when the solvent vaporizes) is small compared with the general forming method.

In view of the above, the applicant is trying to manufacture "a ceramic green sheet in which a conductive layer is buried into a magnetic layer (e.g., ferrite layer)" which has a uniform thickness, by using the gel cast method. Specifically, a conductive layer having a predetermined shape is firstly formed on an upper surface of a lower mold by a printing method. Subsequently, an upper mold is placed on the lower mold to form/provide a space having a constant height to hold/store/accommodate the conductive layer. Thereafter, "a ceramic slurry, in which ferrite powders as ceramic powders and gelatinizing agents are dispersed in dispersion media" is poured into the space to be fixed/hardened in order to form a ferrite-sheet-before-fired in which the conductive layer is buried. As a result, the sheet-before-fired, having the uniform thickness, in which the conductive layer has an increased thickness, can be manufactured/produced.

This sheet has the uniform thickness. Accordingly, in a layered body obtained by layering the sheets, "a thickness of a portion where the conductive layers are formed" and "a thickness of a portion where no conductive layer is formed" are equal to each other. This allows the thickness of the conductive layer to be increased without increasing a distance (a pitch) between conductive layers adjacent to each other in a direction of layering (in the other words, without decreasing the inductance), since the problem such as the delamination hardly occurs. As a result, it is possible to decrease the resistance of the layered inductor without decreasing the inductance of the layered inductor.

In the compact/body formed according to the gel cast method, the ceramic powders are captured in polymer networks, and the amount of shrinkage during drying is therefore small, however, a density of the compact/body becomes small compared to the compact/body formed according to the printing-layering method, and the tape layering method, etc. This causes a large difference in an amount of shrinkage between the conductive layers formed by the printing method and the magnetic layers formed by the gel cast method, while they are fired. As a result, while firing, the structural defect, such as "gaps extending in a direction parallel to layers (hereinafter, referred to as "a side direction gap" or "a side direction crack") may occur, or the desired electrical characteristics may not be obtained. Particularly, if a ratio of a volume of the conductive layers to a volume of the inductor is made larger in order to reduce the resistance of the coil, the structural defect may occur prominently. Accordingly, it turned out that there arises a problem that the inductance decreases extremely.

One of the objects of the present invention is to provide a layered inductor (multi-layered inductor), manufactured using the gel cast method, which has a structure that can avoid the problems described above.

The layered inductor according to the present invention to achieve the object is a layered body in which "silver-based conductive-layers-before-fired (conductive layers that have not been fired)" and "ferrite-based magnetic-layers-before-fired (magnetic layers that have not been fired)" are layered and thereafter simultaneously fired, and in which the conductive-layers-after-fired (fired conductive layers) are via-connected so as to form a helical coil in the magnetic-layers-after-fired (fired magnetic layers).

Further, the layered inductor of the present invention is characterized in that, a shape of a cross sectional surface of each of the conductive layers cut/taken by a plane perpendicular to a longitudinal direction of each of the conductive layers is a substantial trapezoid shape having an upper base and a lower base; and a base angle θ of the trapezoid shape at both end portions of the lower base is equal to or greater than 50° and is smaller than or equal to 80° (50°≦θ≦80°).

According to the features above, a gap (the side direction crack) extending along the direction parallel to the plane of the layer hardly occurs, because "the shape of the cross sectional surface of each of the conductive layers cut by the plane perpendicular to the longitudinal direction of each of the conductive layers (i.e., a shape of the cross sectional surface of the coil)" is substantially trapezoid, and the base angle θ of the trapezoid shape is equal to or greater than 50° and is smaller than or equal to 80°, compared with an inductor in which a shape of a cross sectional surface of the coil is a semi circular shape (or an arc shape). Accordingly, the above delamination and the like do not occur. As a result, the layered inductors having stable electrical characteristics can be provided, according to the present invention.

In this case, it is preferable that the magnetic layers have "a gap/gaps extending so as to have a component along a direction of layering of the layered body (i.e., a component along a direction perpendicular to each of the planes of the layers) and so as to connect between two of the conductive layers adjacent to each other in the direction of layering". "The gap extending so as to have the component along the direction of layering" is referred to as "a vertical direction gap" for convenience.

In the present invention, the shape of the cross sectional surface of the coil is substantially trapezoid, and thus, stress generating during firing process (especially when the body is cooled) concentrates on "the end portions of the lower base" and "the end portions of the upper base". Accordingly, the vertical direction gaps can be positively formed from those end portions as origination points.

The vertical direction gap does not induce (or cause) the delamination, unlike "the side direction gap" extending in the direction parallel to planes of the layers. In addition, the vertical direction gap can release a great internal stress applied to the ferrite-based magnetic layers. Generally, the great internal stress applied to the magnetic layers made of/from ferrite causes a great change in the inductance. Accordingly, having such vertical direction gaps occur positively can provide the inductor whose inductance is in proximity to (close to) a desired/targeted value.

Furthermore, in this case, it is preferable that each of the gaps, in a cross sectional view of the conductive layers and the magnetic layers cut/taken by the plane perpendicular to a longitudinal direction of the conductive layers, extend "downwardly so as to have the component along the direction of layering" from "a surface of each of the conductive layers within ±30 μm along the surface of each of the conductive layers from one of end portions of the lower base of each of the conductive layers", and extend "upwardly so as to have the component along the direction of layering" from "a surface of each of the conductive layers within ±30 μm along the surface of each of the conductive layers from one of end portions of the upper base of each of the conductive layers".

In this case, it is also preferable that one of the vertical direction gaps extend downwardly from an end portion located at an outer circumference side of the coil among both end portions of the lower base of specific one of the conductive layers, another one of the vertical direction gaps extend upwardly from an end portion located at the outer circumference side of the coil among both end portions of the upper base of another one of the conductive layers which is adjacent to and beneath the specific one of the conductive layers, and those two vertical gaps be connected/communicated to each other.

Furthermore, one aspect of the layered inductor having any one of the features described above according to the present invention is an inductor wherein, the fired conductive layers have a great number of holes/pores and a ratio of a total area of the pores to an area of the conductive layer in a cross sectional view of the conductive layers, cut/taken by a plane perpendicular to the longitudinal direction of the conductive layers, is equal to or greater than 2% and is smaller than or equal to 30%, and a ratio D/t1 of an average diameter D of the pores to the thickness t1 of each of the fired conductive layers is equal to or greater than 0.01 and is smaller than or equal to 0.20.

If the area ratio of the pores is smaller than 2%, a hardness of the coil (the fired conductive layers) is so high that a stress can not be concentrated on the end portions of "the upper base and the lower base" of the coil, and the large side direction gaps may therefore occur in the magnetic layers, and thereby, the inductance is not stable. On the other hand, if the area ratio of the pores is greater than 30%, the cross-sectional area of the coil is excessively small, and the resistance of the coil therefore becomes excessively large.

In addition, the stress can be concentrate more easily on the end portions of "the upper base and the lower base" of the coil, when "the pores each having relatively small diameter" which satisfy the described condition that the ratio D/t1 is equal to or greater than 0.01 and is smaller than or equal to 0.20 are dispersed in the coil.

In view of the above, the layered inductor having the inductance in proximity to the desired and targeted value and having the low resistance coil can be provided by means of the above feature.

In this case, it is preferable that a portion of the fired magnetic layer, the portion existing between two of the conductive layers that are adjacent to each other in the direction of layering, have a relative density which is equal to or greater than 84% and is smaller than or equal to 92%, wherein the relative density is 100% when it is assumed that there is no pore in the magnetic layers.

If the relative density of the specific portion is smaller than 84%, a hygroscopicity of the magnetic layer is so high that the reliability of the layered inductor may become low. On the other hand, if the relative density of the specific portion is greater than 92%, uncontrollable gaps (side direction gaps) occur in the magnetic layers. Accordingly, it is possible to provide the layered inductor having the inductance in proximity to the targeted value and high reliability, by having the above feature.

BRIEF DESCRIPTION OF THE DRAWINGS

FIG. 3 is a perspective view of one of ceramic green sheets which constitute the layered inductor shown in FIG. 1;

FIG. 4 is a cross-sectional view of one of the ceramic green sheets which constitute the layered inductor shown in FIG. 1;

FIG. 37 is a cross-sectional view of a sheet for the layered inductor, the sheet being manufactured according to a conventional printing and layering method and the like.

DETAILED DESCRIPTION OF THE INVENTION

Next will be described layered inductors (layered type inductors, multi-layered inductors) according to embodiments of the present invention with reference to the drawings.
<Structure of the Layered Inductor>

Figure 1:
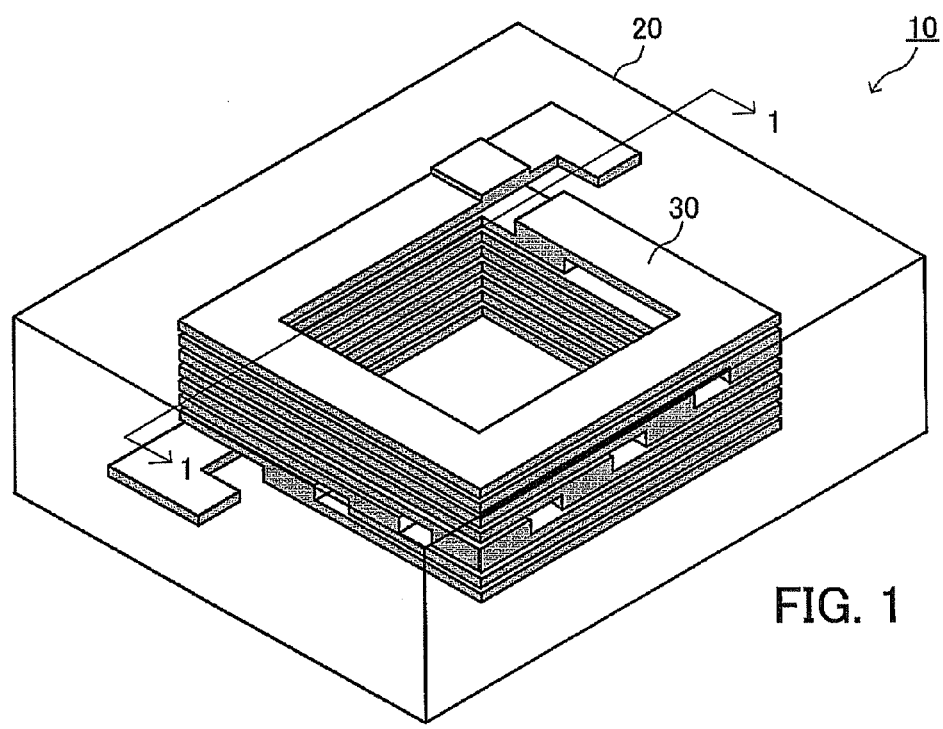
FIG. 1 is a perspective view of a layered inductor according to an embodiment of the present invention.
Figure 2:
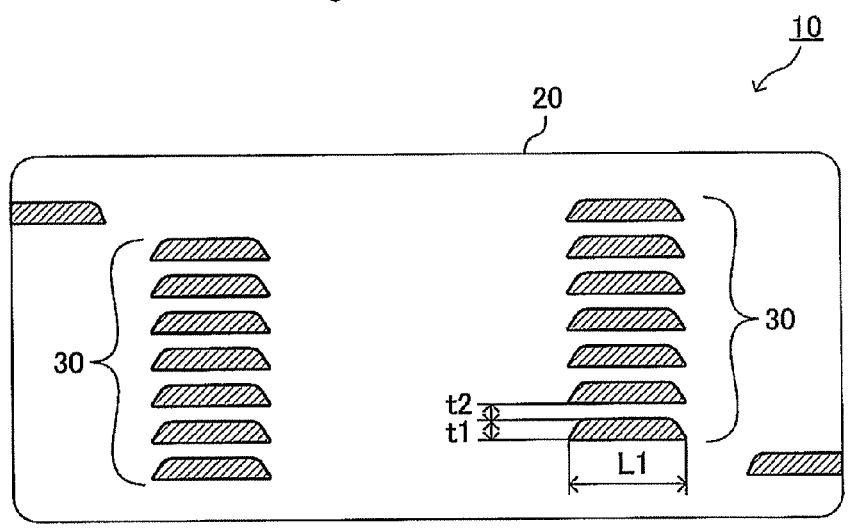
FIG. 2 is a vertical cross-sectional view of the layered inductor shown in FIG. 1.

FIG. 1 is a perspective view of a layered inductor 10 according to an embodiment of the present invention. FIG. 2 is a vertical cross-sectional view of the layered inductor 10, wherein the inductor is cut by a plane along a line 1-1 of FIG. 1. A shape of the layered inductor 10 is a rectangular parallelepiped, having a depth, a width, and a height, each of which is about a few millimeters. The layered inductor 10 comprises a magnetic body portion 20 containing ferrite as a magnetic substance (i.e., ferrite-based magnetic body 20) and coil portion 30 containing silver (Ag) as a conductive material (i.e., silver-based coil portion 30). The magnetic body portion 20 comprises a plurality of magnetic layers integrated/united by being fired. The coil portion 30 comprises a plurality of conductive layers integrated/united by being fired.

The coil portion (the conductive portion) 30 is buried in the magnetic body portion 20 in such a manner that the coil portion 30 has a helical shape. An outer configuration and an inner configuration of the coil portion 30 are both roughly rectangular in plan view. The coil portion 30 is strip-shaped, has a substantially constant width, and is formed of/from "conductive layers containing silver (Ag) as a main component (silver-based-conductive-films)". The width L1 of the coil portion 30 will be described later. A total number of turns of the coil portion 30 is 7.25. It should be noted that the total number of turns (turn number) of the coil portion 30 may appropriately be changed according to a design. For example, the total number of turns of the coil portion 30 may be equal to or more than 5 and be less than or equal to 9.

The layered inductor 10 is manufactured by layering/laminating and pressure bonding a plurality (eight from a first layer 41 to an eighth layer 48 in the present example) of ceramic green sheets shown in FIGS. 3-11, layering and pressure bonding another ceramic green sheets which are not shown (an uppermost ceramic green sheet and a lowermost ceramic green sheet) onto each of an upper surface of and a lower surface of the pressure bonded sheets to form "a layered-body-before-fired", and thereafter, firing "the layered-body-before-fired" simultaneously. Hereinafter, each of the ceramic green sheets is simply referred to as "a sheet". Each of the sheets 41-48 has a uniform thickness.

FIG. 3 is a perspective view of the first layer sheet 41. (a) and (b) of FIG. 4 show cross sectional views of the sheet 41, cut by a plane along a line 2-2 and a plane along a line 3-3 of FIG. 3, respectively. A shape of the sheet 41 in plan view is roughly rectangular.

The sheet 41 is composed of "a magnetic-layer-before-fired 21" which will constitute a part of the magnetic body portion 20 shown in FIGS. 1 and 2, and "a conductive-layer-before-fired 31" which will constitute the coil portion 30 shown in FIGS. 1 and 2.

The magnetic layer 21 is a thin plate obtained by pouring ceramic slurry, in which "ferrite powders as ceramic powders" and "gelatinizing agents" are dispersed in dispersion media, into a mold having a predetermined shape, and thereafter, drying and fixing/hardening the slurry. The magnetic layer 21 has a uniform thickness.

The conductive layer 31 is a thick film obtained by forming/shaping conductive paste comprising silver (Ag) as conductive powders, resins described later, and an organic solvent described later, on a lower mold described later according to a printing method, and thereafter, by drying and fixing the paste.

The conductive layer 31 is composed of a main conductive layer 31a and a via-connection portion 31b.

The main conductive layer 31a is a portion for forming a winding wire portion of the coil portion 30, and is formed so as to have a shape which constitutes a lowermost winding portion of the coil portion 30 after firing. That is, the main conductive layer 31a is, in plan view, has a shape, "which is strip-shaped and has the constant width, and whose outer circumference is roughly rectangular (or roughly square)". The thickness of the main conductive layer 31a is smaller than the thickness of the magnetic layer 21. A lower surface of the main conductive layer 31a exists on the same plane as a lower surface of the magnetic layer 21. That is, the lower surface of the main conductive layer 31a is exposed at the lower surface of the magnetic layer 21. A cross sectional surface of the main conductive layer 31a, cut by a plane perpendicular to a longitudinal direction of the main conductive layer 31a (that is, cut by a plane along a width direction of the main conductive layer 31a) has a trapezoid shape substantially, as shown in (a) and (b) of FIG. 4. The shape of the main conductive layer 31a after fired will be described later in detail.

Figure 5:
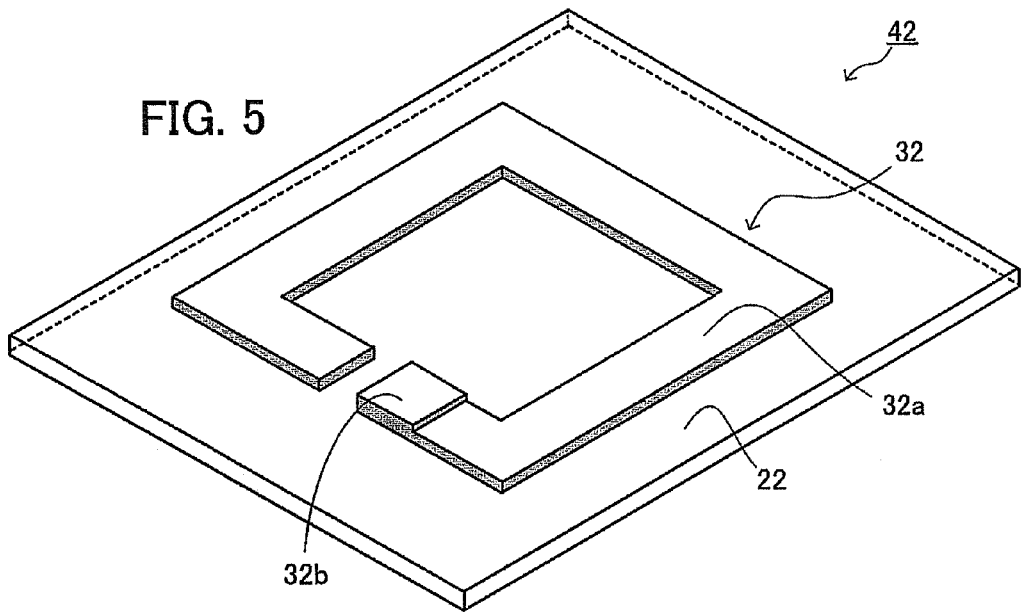
FIG. 5 is a perspective view of another one of the ceramic green sheets which constitute the layered inductor shown in FIG. 1.
Figure 6:
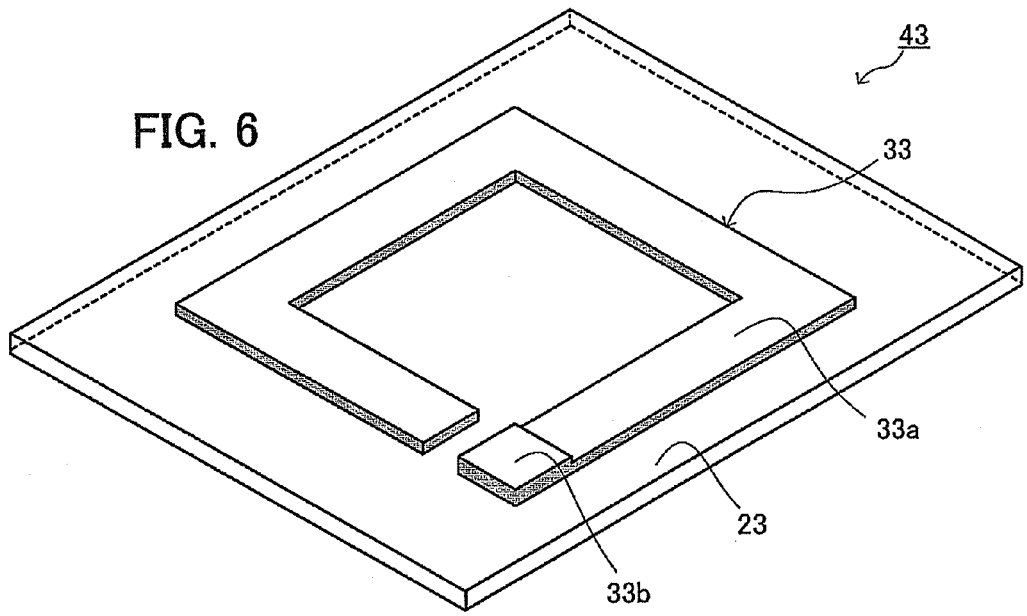
FIG. 6 is a perspective view of another one of the ceramic green sheets which constitute the layered inductor shown in FIG. 1.
Figure 7:
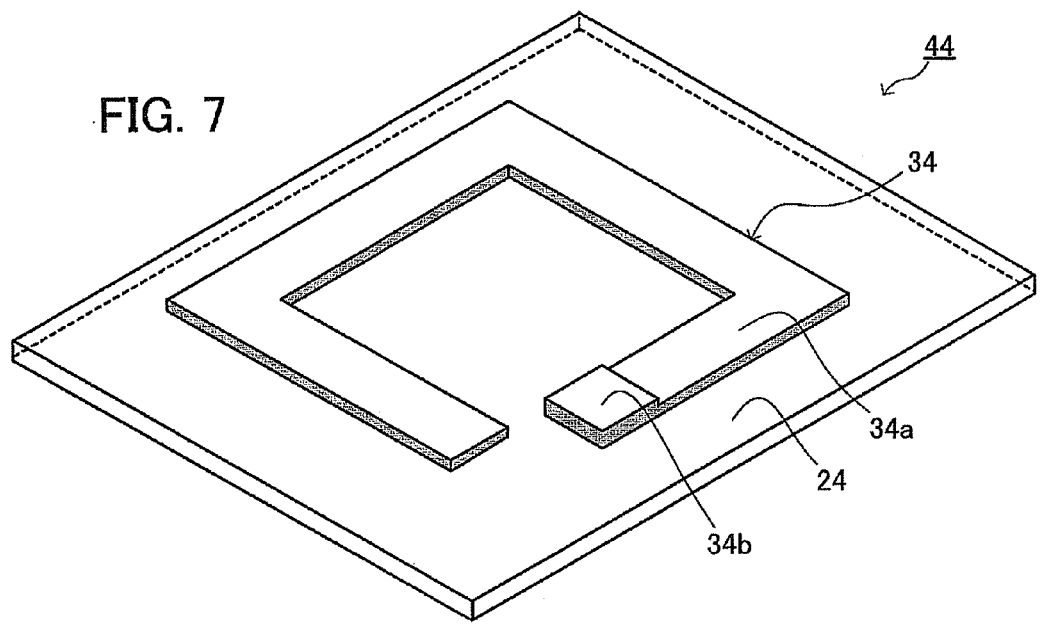
FIG. 7 is a perspective view of another one of the ceramic green sheets which constitute the layered inductor shown in FIG. 1.
Figure 8:
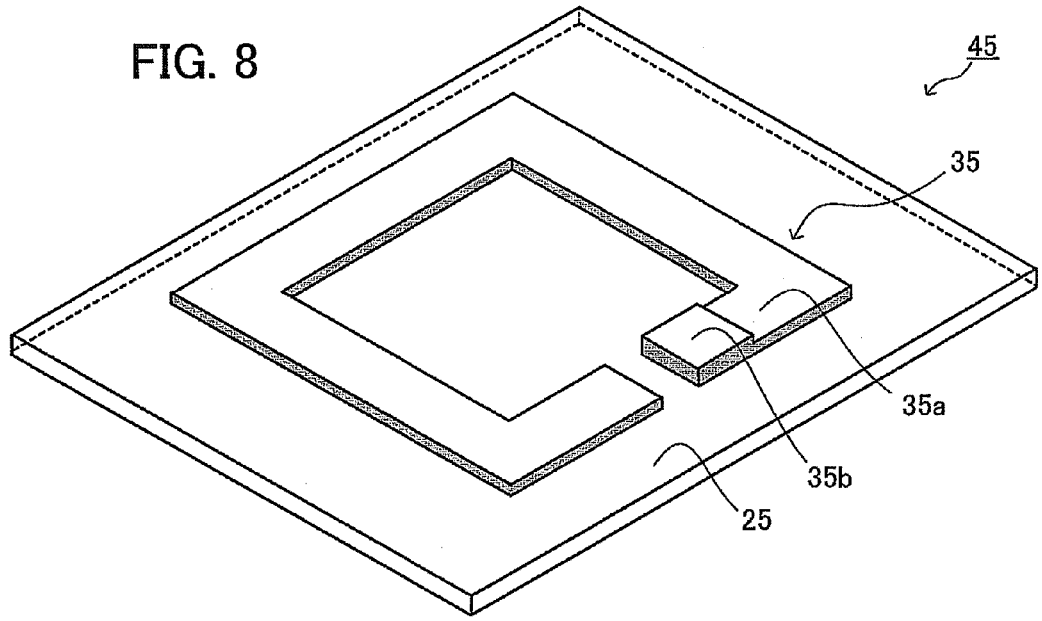
FIG. 8 is a perspective view of another one of the ceramic green sheets which constitute the layered inductor shown in FIG. 1.
Figure 9:
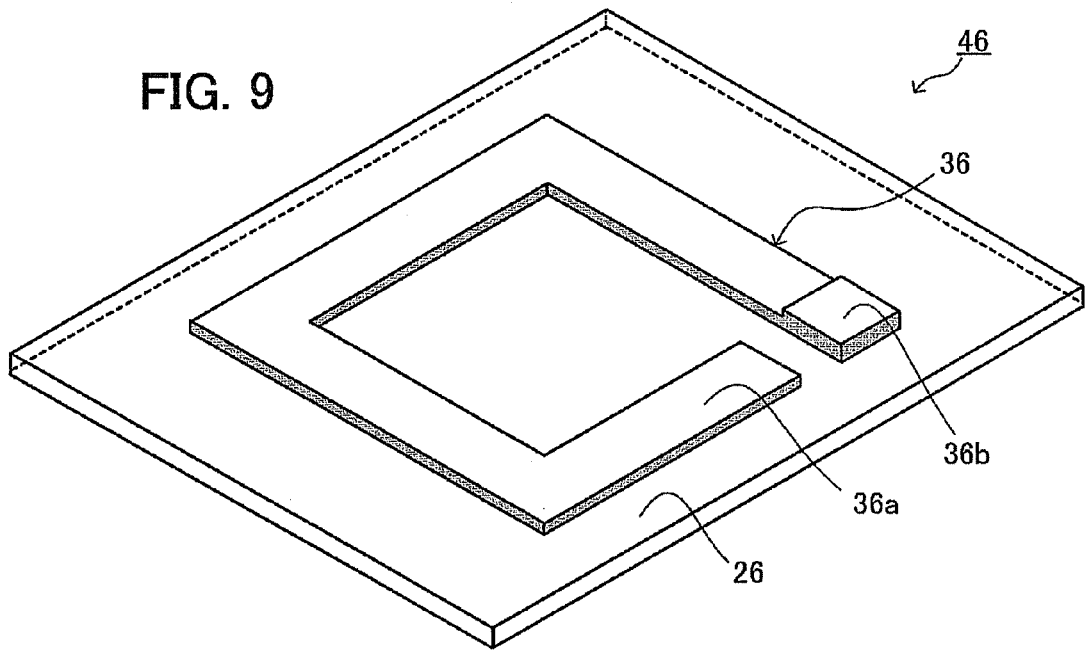
FIG. 9 is a perspective view of another one of the ceramic green sheets which constitute the layered inductor shown in FIG. 1.
Figure 10:
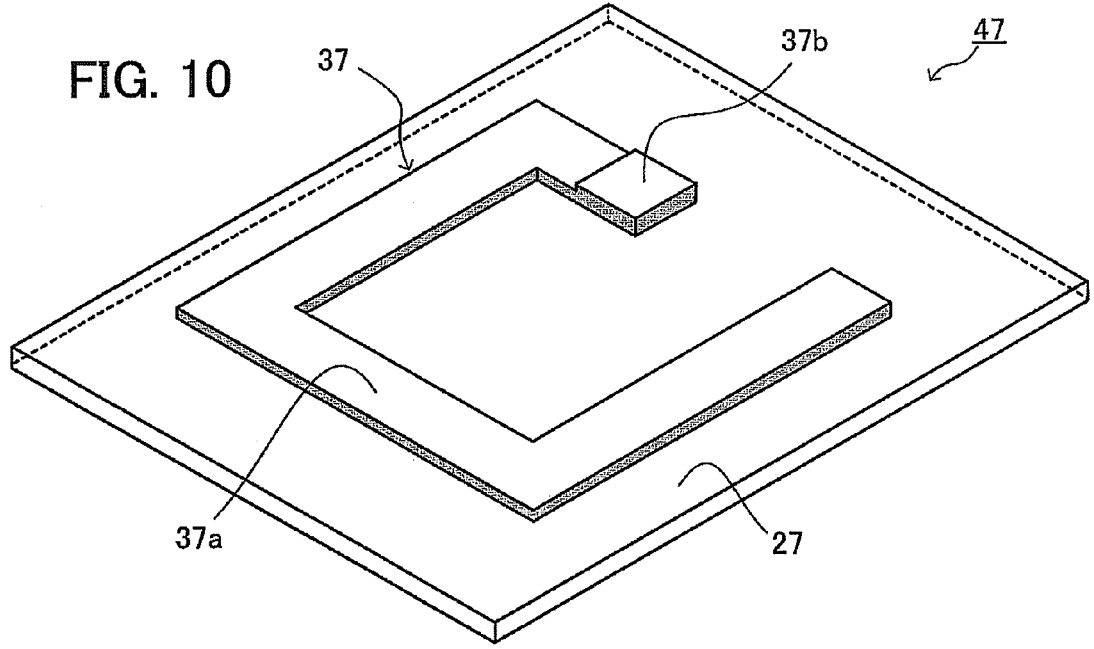
FIG. 10 is a perspective view of another one of the ceramic green sheets which constitute the layered inductor shown in FIG. 1.

The via-connection portion (wiring-connection-portion between layers) 31b is a portion which electrically connects between the main conductive layer 31a and a main conductive layer 32a included in "the second layer sheet 42 shown in FIG. 5" which is layered on the first layer sheet 41. The via-connection portion 31b is connected to the upper surface of the main conductive layer 31a at the end of the main conductive layer 31a, and is exposed at the upper surface of the sheet 41. A shape of the via-connection portion in plan view is roughly square whose side has a length equal to the width of the main conductive layer 31a.

As described above, the sheet 41 has a constant thickness at any portions. That is, the upper surface and the lower surface of the sheet 41 form flat planes parallel to each other. It is therefore said that the sheet 41 is a sheet, which is thin plate-like and has a uniform thickness, comprising "the magnetic-layer-before-fired 21" which will form the magnetic body portion 20 and "the conductive-layer-before-fired 31" which is buried in the magnetic-layer-before-fired 21.

The second layer sheet 42 to the eighth layer sheet 48, as shown in FIGS. 5 to 11, respectively, are different from the first layer sheet 41 only in that the sheets comprise conductive layers 32-38, respectively, each of which has a shape different from the shape of the conductive layer 31 of the first layer sheet 41 in plan view.

The main conductive layer 32a of the second layer sheet 42 is electrically connected to the main conductive layer 33a of the third layer sheet 43 through the via-connection portion 32b. In the same manner, the main conductive layer 33a of the third layer sheet 43 is electrically connected to the main conductive layer 34a of the fourth layer sheet 44 through the via-connection portion 33b. The main conductive layer 34a of the fourth layer sheet 44 is electrically connected to the main conductive layer 35a of the fifth layer sheet 45 through the via-connection portion 34b. The main conductive layer 35a of the fifth layer sheet 45 is electrically connected to the main conductive layer 36a of the sixth layer sheet 46 through the via-connection portion 35b. The main conductive layer 36a of the sixth layer sheet 46 is electrically connected to the main conductive layer 37a of the seventh layer sheet 47 through the via-connection portion 36b. The main conductive layer 37a of the seventh layer sheet 47 is electrically connected to the main conductive layer 38a of the eighth layer sheet 48 through the via-connection portion 37b. In this way, the main conductive layers of the sheets are via-connected so as to form a helical coil.

It should be noted that the via-connection portions 32b-38b of the second layer sheet 42-eighth layer sheet 48 are formed at positions in the sheets, the positions being different from one another in plan view. This allows each of sides of the coil portion 30 to have an equal number of via-connection portions to one another in plan view as much as possible. Notably, it is not necessary to form the via-connection portion 38b, because no conductive layer is formed on the eighth layer sheet 48 shown in FIG. 11. However, in the present example, a dummy via-connection portion (hereinafter, referred to as "a dummy via") 38b is formed so that each of sides of the coil portion 30 can have an equal number of via-connection portions to one another as much as possible in plan view of the coil portion 30. It is preferable that the number of the dummy via be adjusted depending on the number of turn of the coil portion 30. For example, if the number of turn is small, the number of the dummy via may be large in order to adjust a balance of the coil. To the contrary, if the number of turn is large, there may be a case where no dummy via is necessary.

<Method for Manufacturing>

Next will be described a method for manufacturing the layered inductors 10.

1. Preparation (Forming) for Material of the Magnetic Layer.

First, a method for preparing the material of the magnetic layer is described.

1.1: Preparation for Ferrite Powders 1.1.1: Weighing, Mixing, and Drying

Each of $Fe_2O_3$ (grain diameter 0.5 μm), ZnO (grain diameter 0.3 μm), NiO (grain diameter 1 μm), CuO (grain diameter 2 μm), and $MnO_2$ (grain diameter 2 μm) is weighed. The weighed raw material powders are put into a POLYPOT together with zirconia balls and an ion-exchange water, and thereafter, they are wet mixed by a ball milling method for 5 hours to obtain a slurry. The slurry is dried by a drying oven, and then is sieved to obtain powders.

1.1.2: Preliminary-Firing, Milling, and Drying

Subsequently, thus obtained powders are heat treated (or preliminarily fired) for 2 hours at 760° C. (that is, at heat treatment temperature for preparing ferrite powders). It is preferable that this preliminary firing temperature be a temperature lower than a temperature at which ferrite haploidization occurs by 50 to 200° C. For example, the preliminary firing temperature may be an appropriate temperature within 600 to 800° C. When the preliminary firing is performed, a rate of temperature increase and a rate of temperature decrease are 200° C./h. Subsequently, the heat treated powders are put into a POLYPOT together with zirconia balls and an ion-exchange water, and thereafter, wet milled by the ball milling method for 60 hours to obtain a slurry. The time duration for the ball milling may be an appropriate duration within 10 to 80 hours. The thus obtained slurry is dried by the drying oven, and then is sieved to obtain ferrite powders.

1.2: Preparation (Conditioning, Mixing) of a Ferrite Slurry

The obtained ferrite powders, solvent·dispersion media (glutaric acid dimethyl, triacetin), and a dispersing agent (carboxylic copolymer, for example, MALIALIM (trade name)) are weighed and put into a POLYPOT. This weighing is carried out in such a manner that, per 100 parts by weight of the ferrite powders, 20 to 40 parts (27 parts in the present example) by weight of the glutaric acid dimethyl, 2 to 4 parts (3 parts in the present example) by weight of the triacetin, and 1 to 5 parts (3 parts in the present example) by weight of the carboxylic copolymer are measured/taken. Further, zirconia balls are put into the POLYPOT, and wet mixing by the ball milling method is performed to obtain the ferrite slurry.

1.3: Mixing of Gelatinizing Agent

The thus obtained ferrite slurry, "4,4'-diphenylmethane diisocyanate and ethylene glycol" serving as the gelatinizing agent, and "6-Dimethylamino-1-hexanol" serving as a catalyst for reaction are weighed as follows, and they are mixed by a mixer (a hybrid mixer). This weighing is carried out in such a manner that, per 100 parts by weight of the ferrite slurry, 1 to 10 parts (6.4 parts in the present example) by weight of the 4, 4'-diphenylmethane diisocyanate, 0.05 to 2.70 parts (0.35 parts in the present example) by weight of the ethylene glycol, and 0.03 to 2.00 parts (0.06 parts in the present example) by weight of the 6-Dimethylamino-1-hexanol are measured/taken. It should be noted that an ion-exchange water is added before the mixing by an amount of 0.01 to 2.70 parts (0.25 parts in the present example) by weight of the ion-exchange water per 100 parts by weight of the ferrite slurry. In this manner, the slurry (ceramic slurry) which becomes material for the magnetic layer is obtained.

2. Manufacturing the Layered-Body-Before-Fired

Subsequently, the method for manufacturing the layered inductors 10 shown in FIG. 1 is described with reference to FIGS. 12 to 15. It should be noted that FIGS. 12 to 15 show the method to manufacture a single layered inductor 10, in which a single formed compact/body having a predetermined shape (pattern) is formed in each of the sheets, and those sheets are layered to manufacture the single layered inductor 10, for convenience of description. However, in actuality, a plurality (e.g., 1000 to 3000) of compacts having the same shape (pattern) are formed in the sheets, those sheets are layered to form a single layered body, and thereafter, the single layered body is cut to manufacture a plurality of the layered inductor 10 simultaneously.

Hereinafter, "a first shaping mold (lower mold) and a second shaping mold (upper mold)" used to shape or form a sheet 4N (N is an integer number between 1 to 8, that is, the sheet 4N is any one of sheets 41 to 48) are expressed as "the first shaping mold 5N and the second shaping mold 6N", respectively. That is, the highest-order digit of numeral given to the first shaping mold for each of the sheets is "5", and the highest-order digit of numeral given to the second shaping mold for each of the sheets is "6". The lowest-order digit of numeral given to "the specific first shaping mold and the specific second shaping mold" coincides with the lowest-order digit of numeral given to a sheet which is formed by "the specific first shaping mold and the specific second shaping mold". Accordingly, for example, shaping molds used for forming the sheet 41 are the first shaping mold 51 and the second shaping mold 61. Shaping molds used for forming the sheet 42 are the first shaping mold 52 and the second shaping mold 62.

2.1: Coating of Mold Release Agent

Figure 12:
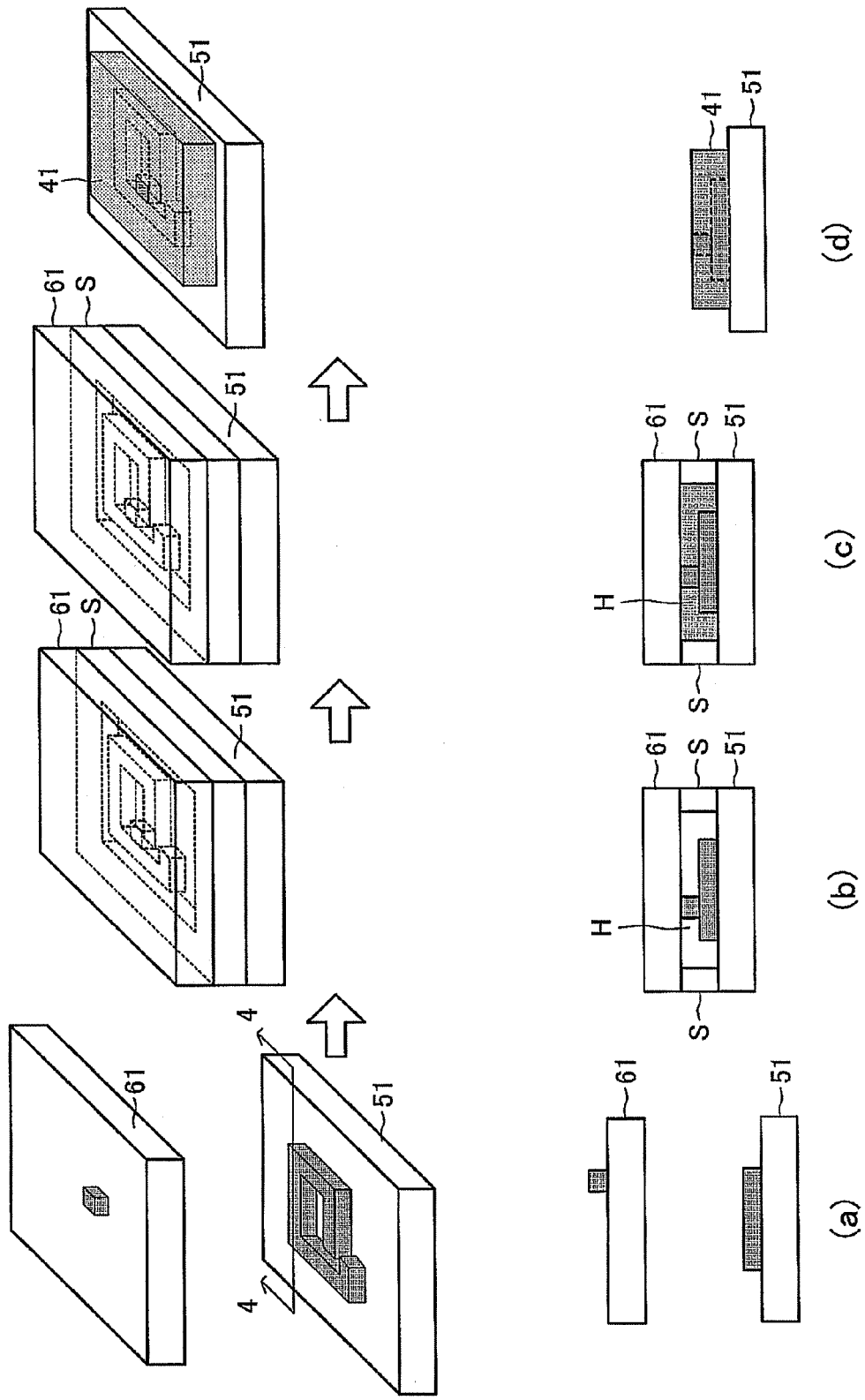
FIG. 12 is a view showing processes to manufacture the layered inductor shown in FIG. 1.

FIG. 12 shows an example to manufacture a single sheet 41 as a representative of the sheets 41 to 48. As shown in FIG. 12, the first shaping mold 51 and the second shaping mold 61, each of which is a stainless (e.g., aluminum alloy such as duralumin) plate-like rectangular parallelepiped, are prepared. Subsequently, mold release agents are coated on surfaces (planes) for molding of the first and second shaping molds 51, 61 so that a nonadherability film is formed on each of the surfaces.

The film is formed in order to control/adjust a force (stress) in a direction of sheet thickness, the force being required to release a compact formed on the surface for molding from the surface (hereinafter, this force is referred to as "a mold release force"). It becomes harder to release the compact from the surface for molding, as the mold release force becomes greater. In the present example, the mold release forces for the first shaping molds 51 to 58 are adjusted so as to be greater than the mold release forces for the second shaping molds 61 to 68, respectively. That is, for example, the mold release force for the first shaping mold 51 is greater than the mold release force for the second shaping mold 61.

Further, among the forces for the first shaping molds 51 to 58, the mold release force for the first shaping mold 51 is greater than any of the mold release forces for the first shaping molds 52 to 58. Furthermore, a force (hereinafter, referred to as "a sheet separating force") in the direction of sheet thickness required to pull apart (separate) one of the sheets from another sheet which are layered on and pressure bonded to the one is controlled (adjusted) to be greater than the mold release force for the first shaping mold 51.

For the film, fluorine resin, silicon resin, fluorine oil, silicon oil, plating, and films by CVD and PVD etc., may be used. When the fluorine resin, the silicon resin, the fluorine oil, or the silicon oil is used, the film is formed by spraying or dipping. In such a case, the mold release force is controlled based on a kind of the resin, surface roughness, thickness of the film, etc. In the present example, a PET film is applied, or a film made from/of a mixture of the fluorine resin (manufactured by, for example, DAIKIN KOGYO, DIE-FREE 3130, 50 parts by weight) and isooctane (50 parts by weight) is formed.

2.2: Printing of a Conductive Pattern

Subsequently (or separately), a paste (hereinafter referred to as "a conductive paste") which will later become the coil portion (conductive body portion) 30 is prepared. As shown in (a) of FIG. 12, the conductive paste are formed on "the surfaces for molding of the first shaping mold 51 on which the film is formed" and on "the surfaces for molding of the second shaping mold 61 on which the film is formed", according to screen printing technique, a metallic mask technique, and so on.

At this time, the conductive paste is formed/shaped on the surface for molding of the first shaping mold 51 in such a manner that the conductive paste has a shape, which is roughly the same shape as the compact which will become the main conductive layer 31*a* included in the sheet 41 shown in FIG. 3, and which has a height lower than the thickness of the sheet 41. This compact is referred to as "a first compact". In addition, the conductive paste is formed on the surface for molding of the second shaping mold 61 in such a manner that the conductive paste has a shape, which is roughly the same shape as the compact which will become the via-connection portion 31*b* included in the sheet 41 shown in FIG. 3, and which has a height lower than the thickness of the sheet 41. This compact is referred to as "a second compact". The thickness of the second compact is adjusted in such a manner that "a sum of the thickness of the first compact and the thickness of the second compact" is equal to or a little bit greater than the thickness of the sheet 41.

For the conductive paste, for example, "silver powders" as the conductive powders, "resins such as phenol resin, urethane resin, acrylic resin, butyral resin, ethyl cellulose, epoxy resin, and theobromine, or resin precursors" as the resin component, and "mixtures of organic solvents such as butyl acetate carbitol, butyl carbitol, 2-ethyl hexanol and terpineol" as the solvent, are used. The formed conductive paste (formed compact) is fixed/hardened through predetermined processes. For example, the paste including the phenol resins is fixed by heat.

It should be noted that, in the present example, the conductive paste comprises 100 parts by weight of silver (Ag) powders, 4 to 10 (6.0 in the present example) parts by weight of thermosetting phenol resin, 2 to 8 (5.3 in the present example) parts by weight of butyl acetate carbitol, and 2 to 10 (4.5 in the present example) parts by weight of melamine resin powders (grain diameter 2 μm). Here, an amount of the melamine resin powders is adjusted in such a manner that a difference in shrinkage between the magnetic body portion (ferrite) 20 and the coil portion (conductive portion) 30, when they are fired, becomes as small as possible.

2.3: Setting Up of the Molds

Subsequently, as shown in (b) of FIG. 12, the second shaping mold 61 is placed above the surface for molding of the first shaping mold 51 on which the first compact has been formed, with placing/interposing a spacer S having a height which is the same as the thickness of the sheet 41 between the first shaping mold 51 and the second shaping mold 61. At this time, the second shaping mold 61 is placed in such a manner that "the surface for molding on which the second compact has been formed" opposes to (or face) "the surface for molding of the first shaping mold 51 on which the first compact has been formed". This allows the first shaping mold 51 and the second shaping mold 61 to be arranged and placed in such a manner that "the surface (plane) for molding of the first shaping mold 51 on which the first compact has been formed" and "the surface (plane) for molding of the second shaping mold on which the second compact has been formed" oppose in parallel to each other, with an interspace/gap whose height is the same as the thickness of the sheet 41, and in such a manner that a top surface of the first compact and a top surface of the second compact contact with each other. It should be noted that a space H defined and formed by "the first shaping mold 51, the second shaping mold 61, and the spacer S" has a profile which is the same as a profile of the sheet 41 (i.e., the rectangular parallelepiped).

2.4: Pouring of the Slurry into the Molds and Fixing of the Slurry

Subsequently, as shown in (c) of FIG. 12, "the ceramic slurry which is the material for the magnetic body portion 20" adjusted as described above is poured into the space H.

Subsequently, the ceramic slurry which was filled/poured into the space H is left for 10 to 30 hours (15 hours in the present example) so as to be fixed/hardened (or solidified). As a result, the sheet 41 is obtained in a state where the first shaping mold 51 and the second shaping mold 61 are attached onto the lower surface and the upper surface of the sheet 41 (i.e., onto both end faces in the direction of the sheet thickness), respectively. Accordingly, the ceramic slurry is formed/shaped so as to have a shape which is the same as the shape (the rectangular parallelepiped) of the sheet 41.

As described above, the ceramic slurry contains the ceramic powders, the dispersion media, and the gelatinizing agent. In addition, it contains the dispersion aid and the catalyst, if necessary. The gelatinizing agent functions to fix/harden the ceramic powders. This fixation of the ceramic slurry allows "the compact obtained by fixing the conductive paste (i.e., the conductive-layer-before-fired) and the ceramic-compact-before-fired (i.e., the magnetic-layer-before-fired)" to be united (or integrated/consolidated). Further, the gelatinizing agent functions as a binder to bond the ceramic green sheets to one another when they are layered.

2.5: Releasing of the Molds

Subsequently, as shown in (d) of FIG. 12, only the second shaping mold 61 is removed from the sheet 41 to which the first and second shaping molds 51, 61 have been attached. As mentioned above, the mold release force for the first shaping mold 51 is adjusted to be greater than the mold release force for the second shaping mold 61. Accordingly, only the second shaping mold 61 can be easily released or removed by applying a pulling force to the first and second shaping molds 51, 61 in the direction of sheet thickness (in the vertical direction) so that these molds separate from each other. As a result, as shown in (d) of FIG. 12, the sheet 41, to which only the first shaping mold 51 is attached, is obtained.

Figure 13:
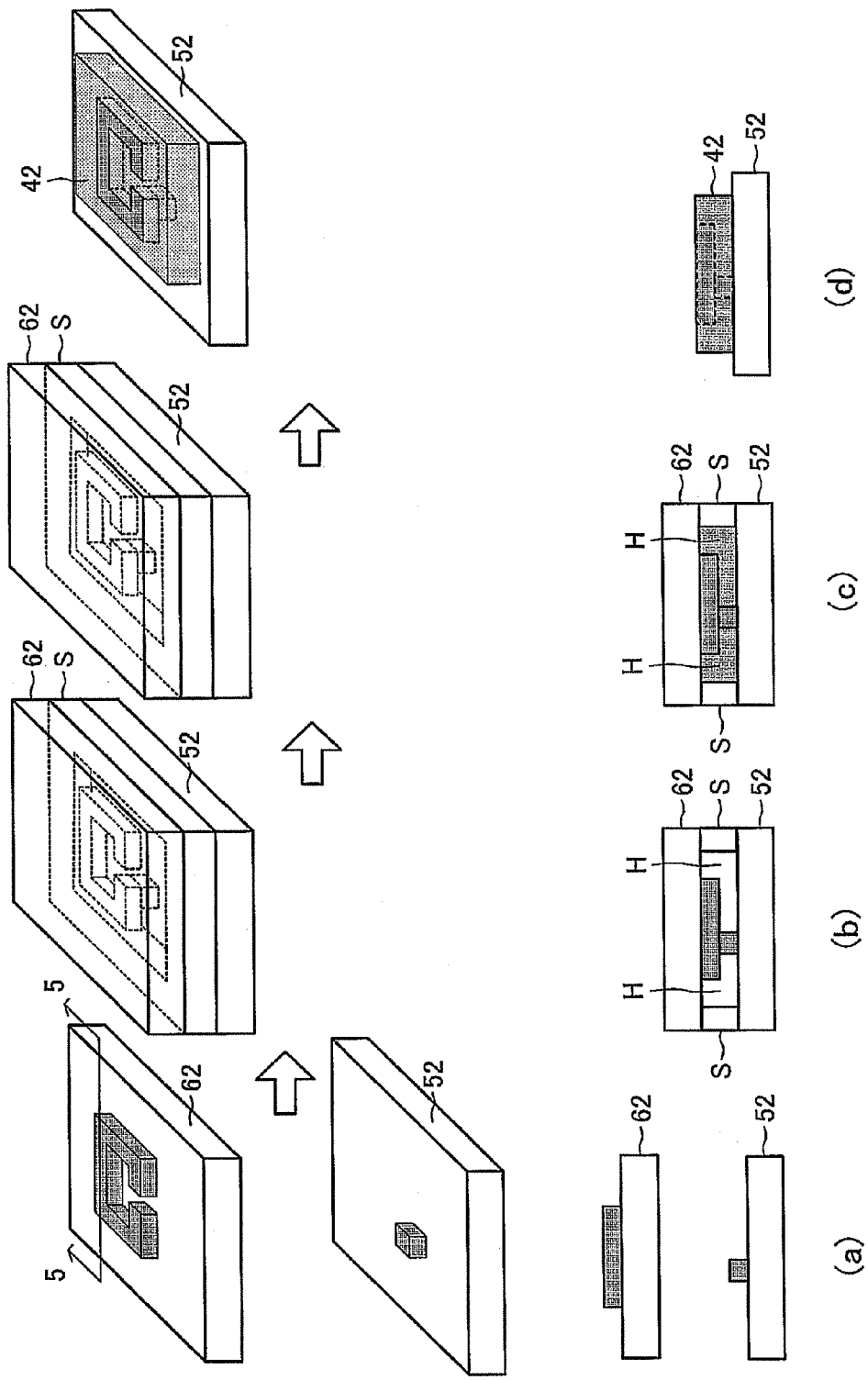
FIG. 13 is a view showing processes to manufacture the layered inductor shown in FIG. 1.

FIG. 13 shows an example to manufacture a sheet 42. (a) to (d) of FIG. 13 correspond to (a) to (d) of FIG. 12, respectively. The method for manufacturing the sheet 42 shown in (a) to (d) of FIG. 13 is similar to the method for manufacturing the sheet 41, except the followings.

The conductive paste is formed on the surfaces for molding of the first shaping mold 52 on which the film is formed in such a manner that the conductive paste has a shape, which is roughly the same shape as the compact which will become the via-connection portion 32*b* included in the sheet 42 shown in FIG. 5, and which has a height lower than the thickness of the sheet 42. This compact is referred to as "a third compact".

The conductive paste is formed on the surfaces for molding of the second shaping mold 62 on which the film is formed in such a manner that the conductive paste has a shape, which is roughly the same shape as the compact which will become the main conductive layer 31*a* included in the sheet 42 shown in FIG. 5, and which has a height lower than the thickness of the sheet 42. This compact is referred to as "a fourth compact". It should be noted that the thickness of the fourth compact is adjusted in such a manner that "a sum of the thickness of the third compact and the thickness of the fourth compact" is "equal to or a little bit greater than "the thickness of the sheet 42". In actuality, the fourth compact is formed in such a manner that the thickness of the fourth compact coincides with the thickness of the first compact.

In this manner, as shown in (d) of FIG. 13, the sheet 42, to which only the first shaping mold 52 is attached, is obtained.

The sheets 43 to 48 can be obtained according to the same method for manufacturing as the methods for manufacturing the sheet 41 and the sheet 42, as described above.

2.6: Layering

Figure 14:
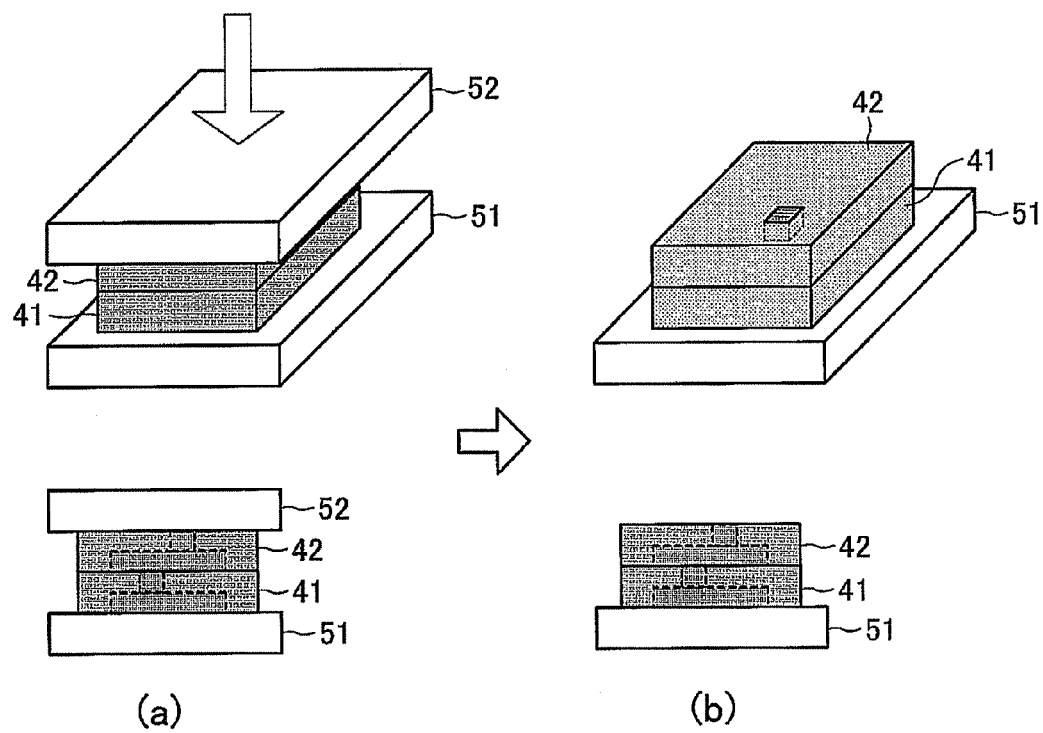
FIG. 14 is a view showing processes to manufacture the layered inductor shown in FIG. 1.

Subsequently, as shown in (a) of FIG. 14, the sheet 42 to which the first shaping mold 52 is attached (refer to (d) of FIG. 13) is reversed (turned over) together with the first shaping mold 52, and is placed on the plane (upper surface) of the sheet 41, the upper surface being exposed by the removal of the second shaping mold 61. At this time, "dispersion media for increasing an adhesion between the sheets" is applied onto the exposed surface of the sheet 41 and the exposed surface of the sheet 42. Accordingly, the exposed plane (surface) of the sheet 41 and the exposed plane (surface) of the sheet 42 contact with each other. Thereafter, the first shaping mold 52 is pressed toward the first shaping mold 51 at a pressure of 50 kg/cm$^2$ or more. As a result, the sheet 41 and the sheet 42 are pressure bonded. At this stage, the sheet 41 and the sheet 42 are sandwiched between the first shaping mold 51 and the first shaping mold 52.

Subsequently, as shown in (b) of FIG. 14, only the first shaping mold 52 is removed from the layered body of the sheets 41 and 42 to which the first shaping molds 51 and 52 have been attached. As mentioned above, the mold release force for the first shaping mold 51 is adjusted to be greater than the mold release force for the first shaping mold 52, and the sheet separating force is adjusted to be greater than the mold release force for the first shaping mold 51. Accordingly, only the first shaping mold 52 can be easily released or removed by applying a pulling force to the first shaping molds 51, 52 in the direction of sheet thickness (in the vertical direction) to separate from each other. As a result, as shown in (b) of FIG. 14, the layered body (the number of layering=2) of the sheets 41 and 42, to which only the first shaping mold 51 is attached, is obtained.

Subsequently, the sheet 43 is manufactured according to processes similar to the processes shown in FIGS. 12 and 13, and then is layered onto and pressure bonded to the layered body of sheets 41 and 42. As a result, a layered body (the number of layering=3) of sheets 41, 42, and 43, to which only the first shaping mold 51 is attached, is obtained. By repeating such processes, a layered body of sheets 41 to 48, to which only the first shaping mold 51 is attached, is obtained, as shown in (a) of FIG. 15.

Figure 15:
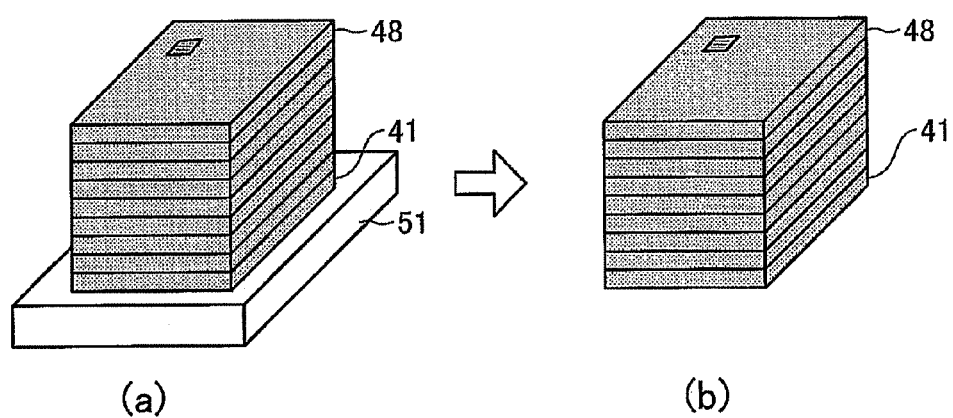
FIG. 15 is a view showing processes to manufacture the layered inductor shown in FIG. 1.
Figure 16:
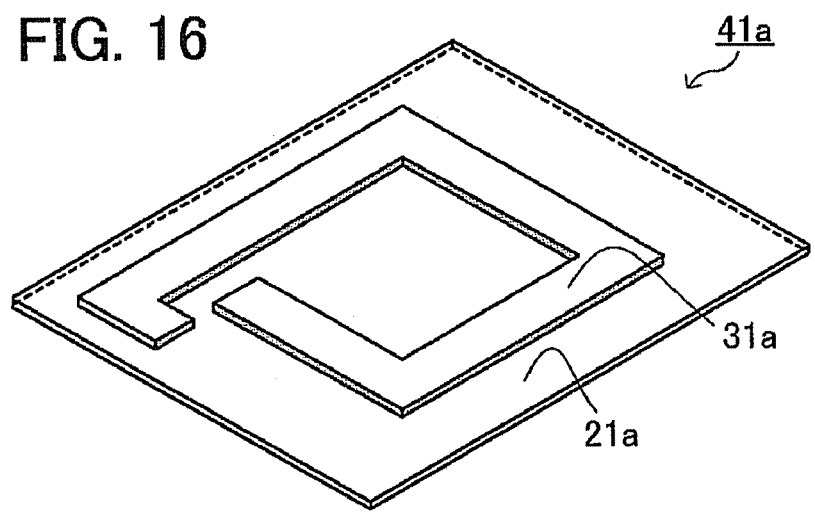
FIG. 16 is a perspective view of a ceramic green sheet which constitutes the ceramic green sheet shown in FIG. 3.

Thereafter, as shown in (b) of FIG. 15, the first shaping mold 51 is removed from the layered body of the sheets 41 to 48 to which only the first shaping molds 51 have been attached. As mentioned above, the sheet separating force is adjusted to be greater than the mold release force for the first shaping mold 51. Accordingly, the first shaping mold 51 can be easily released or removed by applying a pulling force to the first shaping mold 51 in the direction of sheet thickness (in the vertical direction) so that the mold 51 is separate from the layered body of the sheets 41 to 48. In this manner, the layered body shown in (b) of FIG. 15 is obtained/manufactured.

Further, "an uppermost ceramic green sheet" consisting of the magnetic layer only without including the conductive layer is layered and pressure bonded onto an upper surface of the layered body, and "an lowermost ceramic green sheet" consisting of the magnetic layer only without including the conductive layer is layered and pressure bonded onto a lower surface of the layered body. In this manner, a layered-inductor-before-fired for the layered inductor 10 shown in FIG. 1 is obtained. It should be noted that "the lowermost ceramic green sheet" may be formed on the first shaping mold 51, and then, the layered body of the sheets 41 to 48 may be formed thereon according to the method described above, and thereafter, "the uppermost ceramic green sheet" may be layered thereon.

Next will be described another method for manufacturing the layered inductors 10 shown in FIG. 1 with reference to FIGS. 16 to 21. In this, method, each of the sheets 41 to 48 shown in FIGS. 3 to 11, respectively, is actually formed from two sheets. For example, the sheet 41 is manufactured by layering and pressure bonding a sheet 41a shown in FIG. 16 and a sheet 41b shown in FIG. 17. The sheet 41a is a sheet to form the main conducive layer 31a. The sheet 41b is a sheet to form the via-connection portion 31b. Each of the other sheets 42 to 48 consists of two sheets, i.e., one to form the conductive layer and the other one to form the via connection portion.

It should be noted that "a first shaping mold (lower mold) and a second shaping mold (upper mold)" used for forming the sheet 41a are expressed as "the first shaping mold 51a and the second shaping mold 61a", respectively. Similarly, "a first shaping mold (lower mold) and a second shaping mold (upper mold)" used for forming the sheet 41b are expressed as "the first shaping mold 51b and the second shaping mold 61b", respectively. That is, the highest-order digit of numeral given to the first shaping mold for each of the sheets is "5", and the highest-order digit of numeral given to the second shaping mold for each of the sheets is "6". The last two digits of numeral given to "the first shaping mold and the second shaping mold" coincide with the last two digits of numeral given to a sheet which is formed by the molds.

Figure 18:
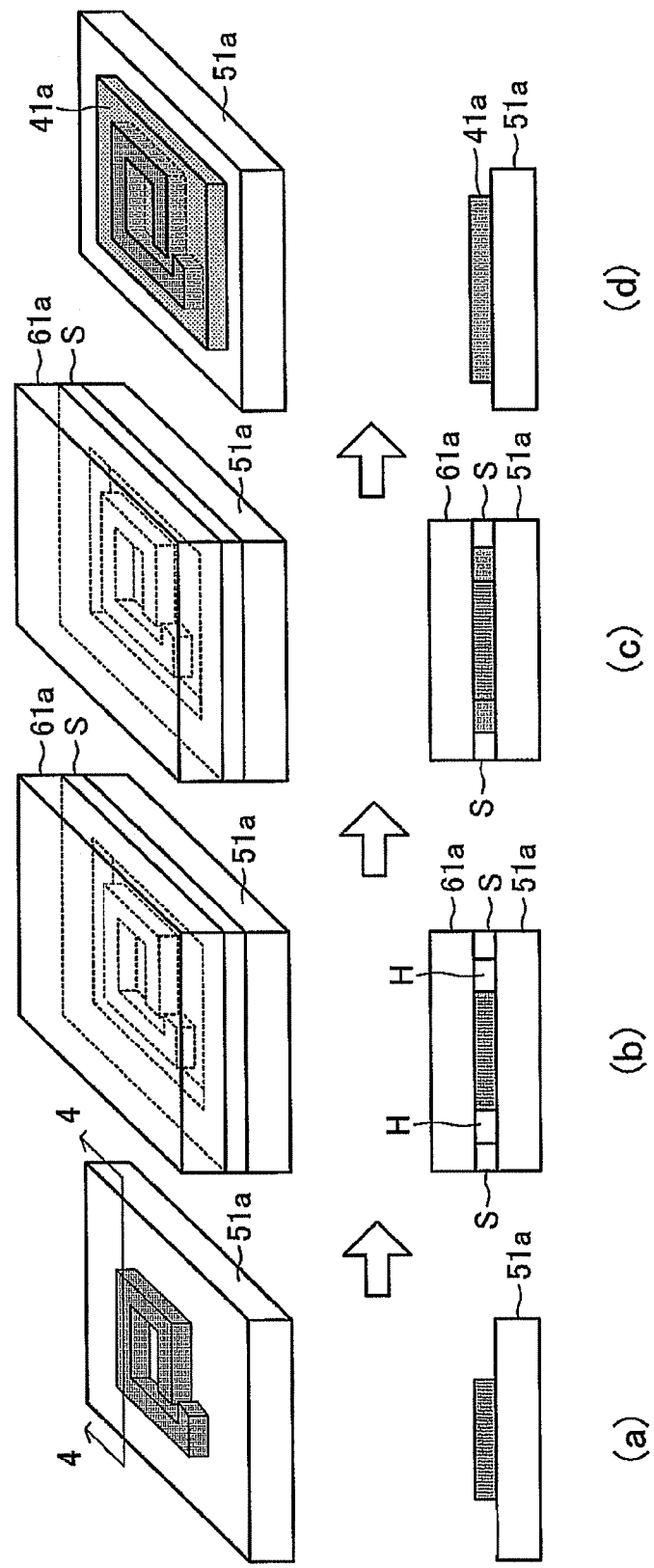
FIG. 18 is a view showing processes to manufacture the layered inductor shown in FIG. 1.
Figure 19:
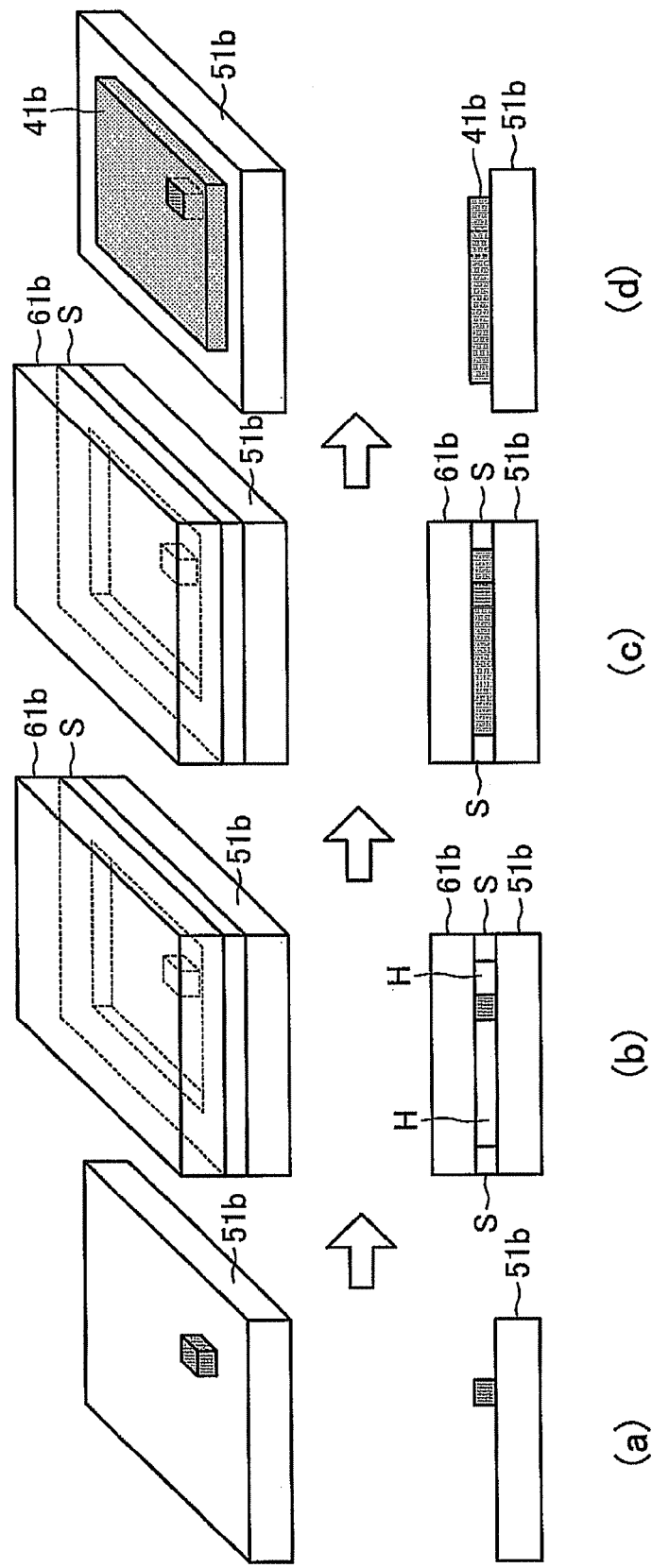
FIG. 19 is a view showing processes to manufacture the layered inductor shown in FIG. 1.

FIG. 18 shows an example to manufacture a single sheet 41a as a representative of the sheets 41a to 48a and sheets 41b to 48b. FIG. 19 shows an example to manufacture a single sheet 41b. The sheet 41 is manufactured through processes shown in FIG. 20. Thereafter, the sheets 42a, 42b, 43a, 43b, 44a, 44b, 45a, 45b, 46a, 46b, 47a, 47b, 48a, and 48b are sequentially layered on the sheet 41 in this order.

Firstly, as shown in (a) of FIG. 18, the first shaping mold 51a and the second shaping mold 61a are prepared. The films described above are formed on the surfaces for molding of the shaping molds 51a and 61a by applying the mold release agents to the surfaces. Such films are formed on the surfaces for molding of the other molds.

By means of the films, the mold release forces for the first shaping molds 51a to 58a, and 51b to 58b are adjusted to be greater than the mold release forces for the second shaping molds 61a to 68a, and 61b to 68b, respectively. That is, for example, the mold release force for the first shaping mold 51a is greater than the mold release force for the second shaping mold 61a.

Further, the mold release force for the first shaping mold 51a is adjusted to be greater than any of the mold release forces for the first shaping molds 52a to 58a and 51b to 58b. Furthermore, the sheet separating force is adjusted to be greater than the mold release force for the first shaping mold 51a.

Subsequently (or separately), the conductive paste described above is prepared. As shown in (a) of FIG. 18, the conductive paste is formed on "the surfaces for molding of the first shaping mold 51a on which the film is formed" by a screen printing technique, etc. At this time, the conductive paste is formed in such a manner that the conductive paste has a shape, which is roughly the same shape as the compact included in the sheet 41a shown in FIG. 16, and which has a height which is the same as (or a little bit higher) than the thickness of the sheet 41a.

Subsequently, as shown in (b) of FIG. 18, the second shaping mold 61a is placed above the surface for molding of the first shaping mold 51a on which the compact has been formed, in such a manner that the surface for molding of the second shaping mold 61a on which the film has been formed faces downward. At this time, a spacer S having a height which is the same as the thickness of the sheet 41a is interposed (placed) between the first shaping mold 51a and the second shaping mold 61a. It should be noted that a space H defined and formed by "the first shaping mold 51a, the second shaping mold 61a, and the spacer S" has a profile which is the same as a profile of the sheet 41a (i.e., the rectangular parallelepiped).

Subsequently, as shown in (c) of FIG. 18, "the ceramic slurry which will become the material for the magnetic body portion 20" adjusted as described above is poured into the space H.

Subsequently, the ceramic slurry which was filled into the space H is left for 10 to 30 hours (15 hours in the present example) to be fixed (or solidified). As a result, the sheet 41a is obtained in a state where the first shaping mold 51a and the second shaping mold 61a are attached onto the lower surface and the upper surface of the sheet 41 (i.e., onto both end faces in the direction of the sheet thickness), respectively.

Subsequently, as shown in (d) of FIG. 18, only the second shaping mold 61a is removed from the sheet 41a to which the first and second shaping molds 51a, 61a have been attached. As mentioned above, the mold release force for the first shaping mold 51a is adjusted to be greater than the mold release force for the second shaping mold 61a. Accordingly, only the second shaping mold 61a can be easily released or removed by applying a pulling force to the first and second shaping molds 51a, 61a in the direction of sheet thickness (in the vertical direction) so that the molds separate from each other. As a result, as shown in (d) of FIG. 18, the sheet 41a, to which only the first shaping mold 51a is attached, is obtained.

FIG. 19 shows an example to manufacture the sheet 41b. (a) to (d) of FIG. 19 correspond to (a) to (d) of FIG. 18, respectively. The method for manufacturing the sheet 41b shown in (a) to (d) of FIG. 19 is similar to the method for manufacturing the sheet 41a shown in (a) to (d) of FIG. 18, except that a shape of the conductive paste which is formed on the surface for molding of the first shaping mold 51b is different from a shape of the conductive paste which is formed on the surface for molding of the first shaping mold 51a.

Figure 17:
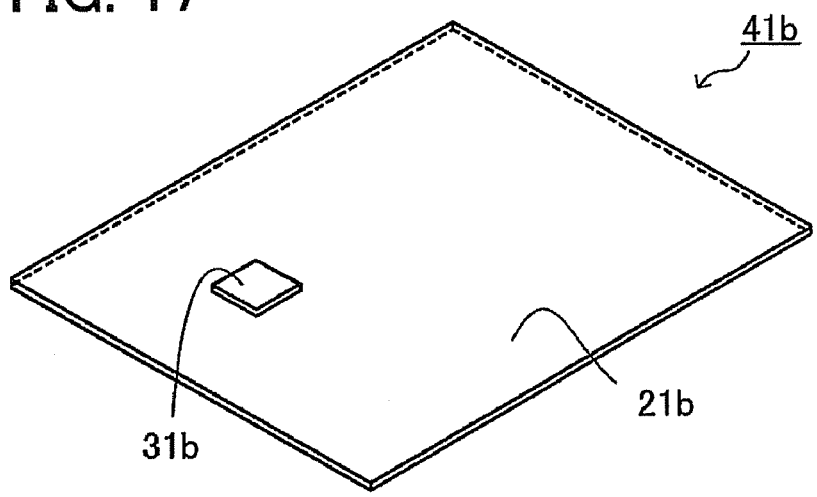
FIG. 17 is a perspective view of the other ceramic green sheet which constitutes the ceramic green sheet shown in FIG. 3.

More specifically, the conductive paste is formed on the surfaces for molding of the first shaping mold 51b in such a manner that the conductive paste has a shape, which is roughly the same shape as the compact included in the sheet 41b shown in FIG. 17, and which has a height which is the same as (or a little bit higher than) the thickness of the sheet 41b. Detail descriptions on the method for manufacturing the sheet 41b shown in (a) to (d) of FIG. 19 are omitted. In this manner, the sheet 41b to which only the first shaping mold 51b is attached is obtained, as shown in (d) of FIG. 19.

Figure 20:
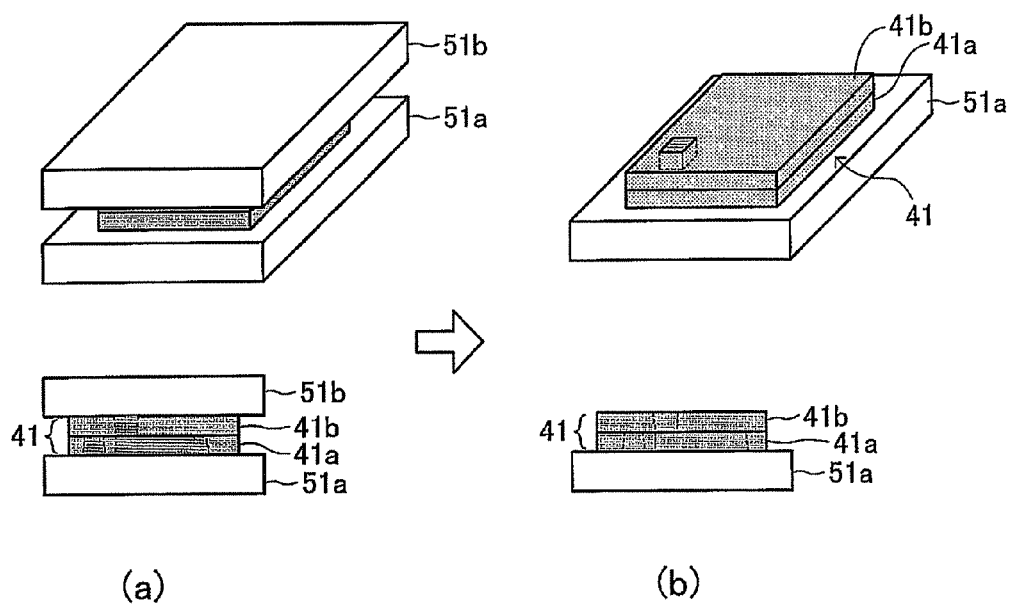
FIG. 20 is a view showing processes to manufacture the layered inductor shown in FIG. 1.

Subsequently, as shown in (a) of FIG. 20, the sheet 41b to which the first shaping mold 51b is attached (refer to (d) of FIG. 19) is reversed (turned over) together with the first shaping mold 51b, and is placed on the plane (upper surface) of the sheet 41a, the upper surface being exposed by the removal of the second shaping mold 61a. At this time, "dispersion media for increasing an adhesion between the sheets" is applied onto the exposed surface of the sheet 41a and the exposed surface of the sheet 41b. Accordingly, the exposed plane (surface) of the sheet 41a and the exposed plane (surface) of the sheet 41b contact with each other. Thereafter, the first shaping mold 51b is pressed toward the first shaping mold 51a at a pressure of 50 kg/cm² or more. As a result, the sheet 41a and the sheet 41b are pressure bonded so that the sheet 41 (refer to FIG. 3) having these sheets (41a, 41b) is obtained. At this stage, the sheet 41 is sandwiched between the first shaping mold 51a and the first shaping mold 51b.

Subsequently, as shown in (b) of FIG. 20, only the first shaping mold 51b is removed from the layered body (i.e. the sheet 41) of the sheets 41a and 41b to which the first shaping molds 51a and 51b have been attached. As mentioned above, the mold release force for the first shaping mold 51a is adjusted to be greater than the mold release force for the first shaping mold 51b, and the sheet separating force is adjusted to be greater than the mold release force for the first shaping mold 51a. Accordingly, only the first shaping mold 51b can be easily released or removed by applying a pulling force to the first shaping molds 51a, 51b in the direction of sheet thickness to separate from each other. As a result, as shown in (b) of FIG. 20, the layered body (the number of layering=2) of the sheets 41a and 41b, to which only the first shaping mold 51a is attached, is obtained.

Subsequently, the sheet 42a is manufactured according to processes similar to the processes shown in FIG. 19. The sheet 42a is then layered and pressure bonded onto the layered body of sheets 41a and 41b according to processes similar to the processes shown in (a) and (b) of FIG. 20. As a result, a layered body (the number of layering=3) of sheets 41a, 41b, and 42a, to which only the first shaping mold 51a is attached, is obtained. By repeating these processes, a layered body of sheets 41 to 48, to which only the first shaping mold 51a is attached, is obtained, as shown in (a) of FIG. 21.

Figure 21:
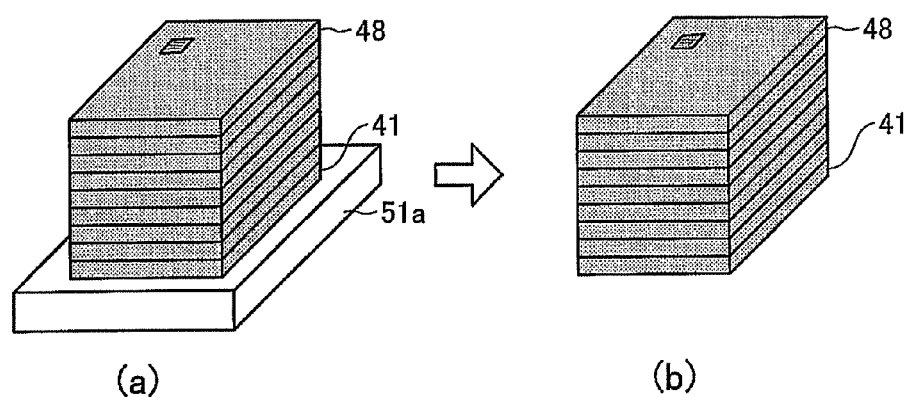
FIG. 21 is a view showing processes to manufacture the layered inductor shown in FIG. 1.

Thereafter, as shown in (b) of FIG. 21, the first shaping mold 51a is removed from the layered body of the sheets 41 to 48 to which only the first shaping molds 51a have been attached. As mentioned above, the sheet separating force is adjusted to be greater than the mold release force for the first shaping mold 51a. Accordingly, the first shaping mold 51a can be easily released or removed by applying a pulling force to the first shaping mold 51a in the direction of sheet thickness so that the mold 51 is separate from the layered body of the sheets 41 to 48. In this manner, the layered body shown in (b) of FIG. 21 is manufactured.

Further, "an uppermost ceramic green sheet" consisting of the magnetic layer only without including the conductive layer is layered and pressure bonded onto an upper surface of the layered body, and "an lowermost ceramic green sheet" consisting of the magnetic layer only without including the conductive layer is layered and pressure bonded onto a lower surface of the layered body. In this manner, a layered-inductor-before-fired for the layered inductor 10 shown in FIG. 1 is obtained.

2.7: Drying

Figure 11:
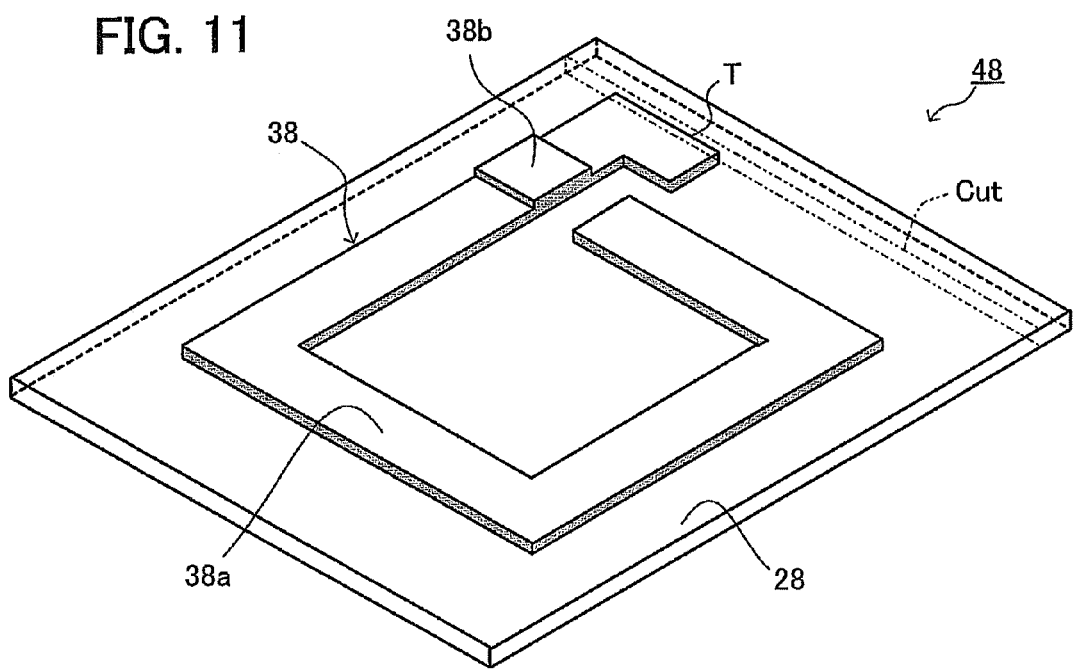
FIG. 11 is a perspective view of another one of the ceramic green sheets which constitute the layered inductor shown in FIG. 1.

Subsequently, the thus obtained layered-body-before-fired is dried by a drying oven. After the drying process, the layered body is cut in such a manner that terminals T shown in FIGS. 3 and 11 are exposed at edges of the layered body (refer to cutting lines Cut shown in FIGS. 3 and 11).

2.8: Printing of Electrode Terminals

Subsequently, electrode terminals each of which has a predetermined shape are formed by printing or dipping. It should be noted that the electrode terminals may be printed after a firing process described later.

2.8: Firing (Burning/Sintering)

Subsequently, the layered-body-before-fired is fired.

Figure 22:
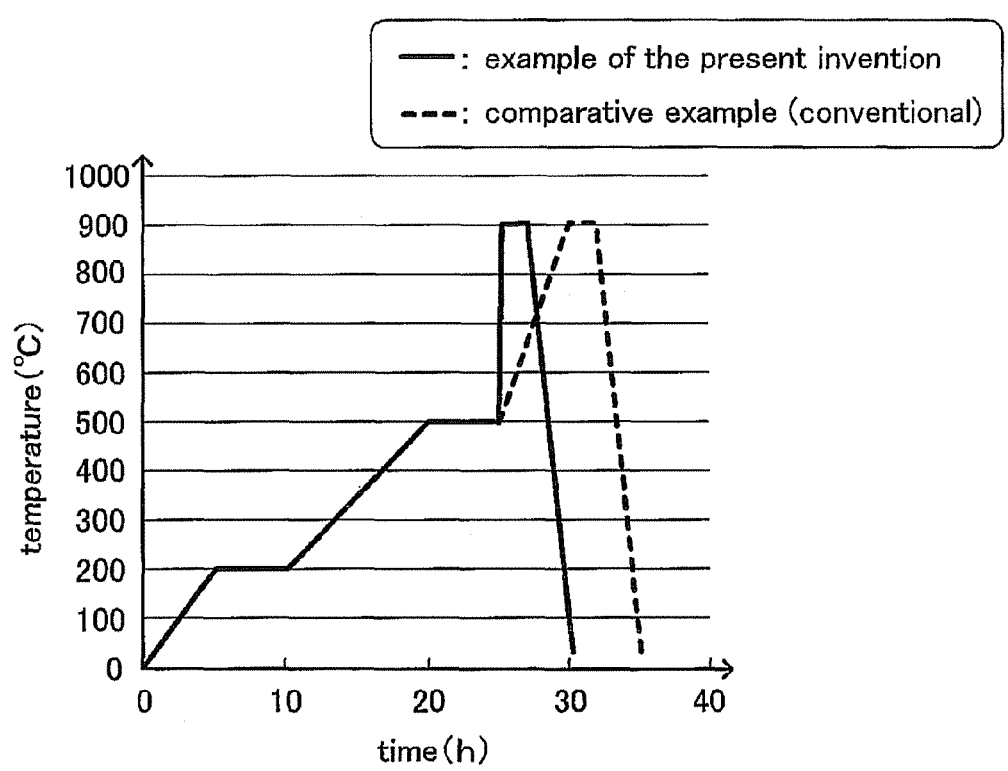
FIG. 22 is a graph showing temperature in a firing process to manufacture the layered inductor shown in FIG. 1.

The pattern of temperature change when firing (firing profile) is shown in Table 1 and by a solid line in FIG. 22.

TABLE 1

| Time(h) | 0 | 5 | 10 | 20 | 25 | 25.2 | 27.2 | 30.2 |
|---|---|---|---|---|---|---|---|---|
| Temperature (° C.) | 0 | 200 | 200 | 500 | 500 | 900 | 900 | 30 |

It should be noted that a conventional firing profile is shown in Table 2 and by a dashed line in FIG. 22.

TABLE 2

| Time(h) | 0 | 5 | 10 | 20 | 25 | 30 | 32 | 35 |
|---|---|---|---|---|---|---|---|---|
| Temperature (° C.) | 0 | 200 | 200 | 500 | 500 | 900 | 900 | 30 |

It is clear from comparison between the Table 1 and Table 2 (comparison between the solid line and the dashed line in FIG. 22), that in the firing profile according to the present embodiment (hereinafter referred to as "the present firing profile"), the temperature is rapidly increased up to 900° C. to fire the layered-body-before-fired, after "a degreasing period in which the temperature is kept at 500° C. for 5 hours" which is a period between 20 to 25 hours after a start of rising temperature. That is, a rate of temperature increase after the degreasing period in the comparative example is "80° C./h", whereas a rate of temperature increase after the degreasing period in the present firing profile is "2000° C./h". It should be noted that the present firing profile is not limited to the profile shown in Table 1, but may be a different firing profile in which the temperature is increased from 500° C. to a keeping temperature which is equal to or higher than 850° C. and is lower than or equal to 950° C. within 30 minutes, after the degreasing period in which the temperature is kept at 500° C.

This rapid temperature increase up to the firing temperature after the degreasing period allows a timing from which the magnetic body portion (ferrite) 20 including ferrite as the magnetic substance starts to be fired to substantially coincide with a timing from which the coil portion (the conductive portion) 30 including silver as the conductive substance starts to be fired. In other words, it is possible that the magnetic body portion 20 and the coil portion 30 start to shrink due to firing substantially simultaneously. In addition, in the present embodiment, the conductive paste which is the material for the coil portion is adjusted in such a manner that the difference in shrinkage between the magnetic body portion 20 and the coil portion 30 becomes as small as possible when they are fired, as described above.

As a result, in the layered inductor 10 according to the present embodiment, "the delamination" described above does not occur. Further, the problem that "the inductor does not have the desired electrical characteristic", such as a significant decrease of the inductance, does not arise.

Thereafter, the electrode terminals are formed on the fired layered body so that the layered inductor 10 shown in FIG. 1 is manufactured.

Structural Features of the Present Embodiment

Next will be described structural features of the layered inductor 10 according to the present embodiment.
1. Definitions of Parameters.

First, various parameters are defined. Hereinafter, "a conductive layer" means the main conductive layer 31a which is the coil portion except the via-connection portion 31b. All of the parameters defined below are values about the fired (post-fired) conductive layer and the fired (post-fired) magnetic layer.

Figure 23:
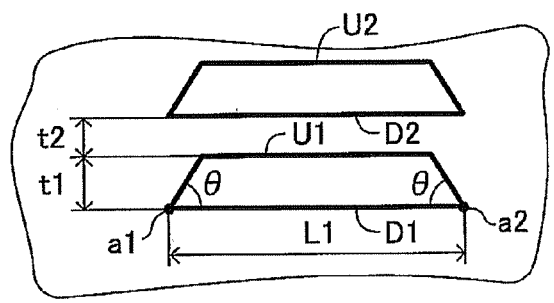
FIG. 23 is a vertical cross-sectional view of conductive layers (coil portion) according to an example of the present invention.

As shown in FIG. 23, the conductive layer has a cross sectional surface (i.e., cross sectional view of the coil), obtained by cutting the conductive layer along a plane perpendicular to a longitudinal direction of the conductive layer (that is, a plane along a width direction of the conductive layer), which has a substantial trapezoid shape having an upper base U1 and a lower base D1.
<Thickness t1 of the Fired Conductive Layer>

As shown in FIG. 23, a thickness t1 of the fired conductive layer is a height of the trapezoid shape described above. That is, the thickness t1 of the fired conductive layer is a distance between the upper base U1 and the lower base D1.
<Thickness t2 of a Specific Portion of the Fired Magnetic Layer>

As shown in FIG. 23, a thickness t2 of a specific portion of the fired magnetic layer is a distance between the upper base U1 of one conductive layer and the lower base D2 of another conductive layer adjacent to the one conductive layer in the direction of layering. In other words, "the specific portion of the fired magnetic layer" means a portion of the magnetic layer existing between two conductive layers that are adjacent to each other in the direction of layering.
<A Pitch of the Fired Conductive Layers>

A pitch of the fired conductive layers is a distance between two conductive layers adjacent to each other in the direction of layering and is equal to t1+t2.
<A Width L1 of the Fired Conductive Layer>

A width L1 of the fired conductive layer, as shown in FIG. 23, is a length of the lower base D1 (i.e., a distance between a point a1 and a point a2, that are both end portions of the lower base D1).
<A Base Angle θ of the Fired Conductive Layer>

A base angle θ of the fired conductive layer is an angle of the trapezoid shape at the both end portions of the lower base D1.

Figure 24:
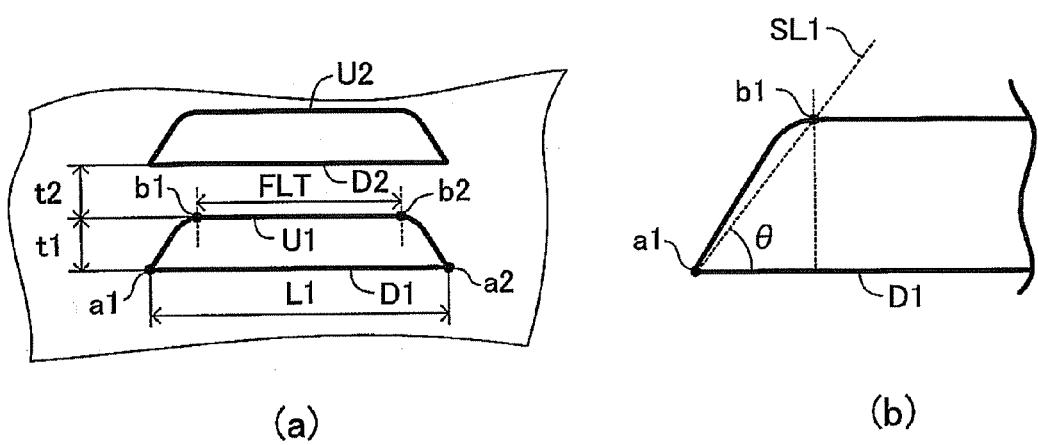
FIG. 24 is a vertical cross-sectional view of conductive layers (coil portion), each having another shape, according to an example of the present invention.

For example, as shown in (a) of FIG. 24, when the shape of the cross sectional surface of the coil portion is "a substantial trapezoid shape having R shapes (or arc shapes) at corners of both end portions of the upper base", a flat portion FLT of the upper base is specified. The points at both end portions of the flat portion FLT are defined as a point b1 and a point b2. In this case, the thickness t1 of the conductive layer is a distance between the lower base D1 and the flat portion FLT. Further, as shown in (b) of FIG. 24, the base angle θ of the conductive layer is an angle between a straight line SL1 and the lower base D1, the straight line SL1 is a line passing through "the end point b1" and "the end point a1 of the lower base D1 being closer to the point b1 than the point b2". In other words, the base angle θ of the conductive layer is an angle between the lower base D1 and the straight line SL1, the straight line SL1 passing through "the end point b1" and "the end point a1 of the lower base D1, which is a vertex of an oblique line portion extending from the point b1 and the lower base D1".

Figure 25:
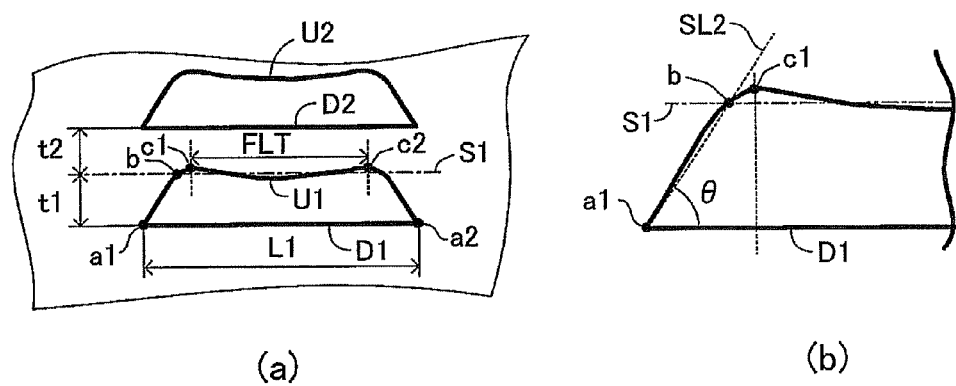
FIG. 25 is a vertical cross-sectional view of conductive layers (coil portion), each having yet another shape, according to an example of the present invention.

For example, as shown in (a) of FIG. 25, when the shape of the cross sectional surface of the coil portion is "a substantial trapezoid shape having a top portion at each of the portions near the both end portions of the upper base", the top portion c1 and the other top portion c2 is specified. Further, a portion between the top portion c1 and the top portion c2 is defined as the flat portion FLT. In this case, the thickness t1 of the conductive layer is an average value of a distance between each of points on the upper base U1 within the thus defined flat portion FLT and the lower base D1 (refer to a straight line S1). The thickness t2 of the specific portion of the magnetic layer is a distance between the flat potion FLT (shown by the straight line S1) of one of the conductive layers and the lower base D2 of the other conductive layer adjacent to the one conductive layer in the direction of layering. In addition, as shown in (b) of FIG. 25, the base angle θ of the conductive layer is an angle between a straight line SL2 and the lower base D1, the straight line SL2 passing through "a point b at which the straight line S1 intersects with the oblique line portion" and "an end point a1 of the lower base D1 which is a vertex of the oblique line portion passing through the point b and the lower base D1".

Figure 26:
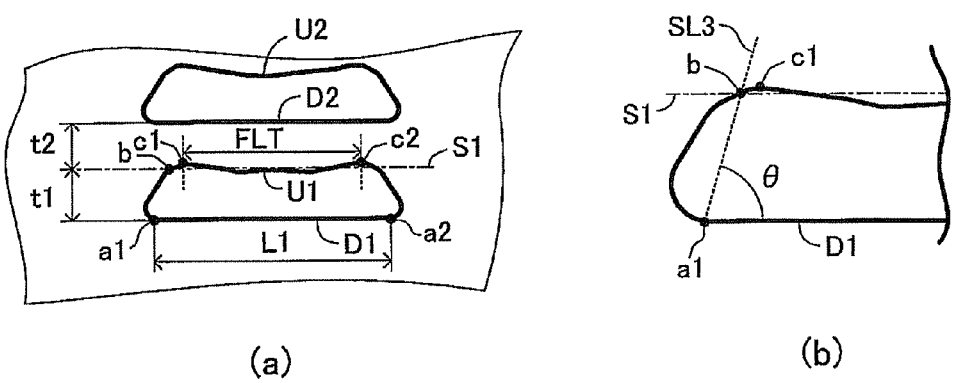
FIG. 26 is a vertical cross-sectional view of conductive layers (coil portion), each having still another shape, according to an example of the present invention.

For example, as shown in (a) of FIG. 26, when the shape of the cross sectional surface of the coil portion is "a substantial trapezoid shape having R shapes (or arc shapes) at corners of both end portions of the lower base D1", a point a1 and a point a2 of the end portions of the lower base D1 is defined as both end points of a flat portion of the lower base. In other words, the width L1 of the conductive layer is, as shown in (a) of FIG. 26, a length of the flat portion of the lower base D1 (i.e., a distance between the point a1 and the point a2). Furthermore, as shown in (b) of FIG. 26, the base angle θ is an angle between a straight line SL3 and the lower base D1, the straight line SL3 passing through the point a1 (or the point a2) and the point b (or the point b1) that are specified as described above.

Figure 27:
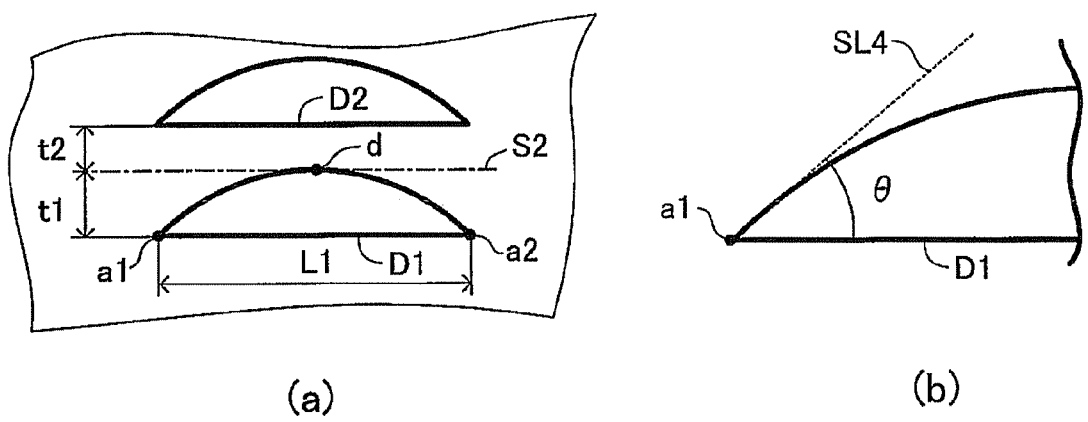
FIG. 27 is a vertical cross-sectional view of conductive layers (coil portion), each having another shape, according to an comparative example.

As described above, the conductive layer of the inductor according to the present invention has a cross-sectional shape having the substantial trapezoid shape which has the upper base U1 and the lower base D1. To the contrary, in a comparative example as shown in (a) of FIG. 27 (i.e. the comparative example to which the present invention is not applied), when the shape of the cross sectional surface of the coil portion is not the substantial trapezoid shape, but is "a substantial semi circular shape (an arc shape)", a top portion d may be specified. In this case, the thickness t1 of the conductive layer is defined as a distance between the top portion d and the lower base D1. The thickness t2 of the specific portion of the magnetic layer is a distance between the top portion d (see a straight line S2) of one conductive layer and the lower base D2 of another conductive layer adjacent to the one conductive layer in the direction of layering. Furthermore, as shown in (b) of FIG. 27, the base angle θ of the conductive layer in this comparative example is defined as an angle between a tangent line SL4 to the oblique line portion at a point a1 and the lower base D1, the point a1 being one of both end portions of the lower base D1.

2. The Structural Features

The layered inductors 10 of the embodiments according to the present invention have the features described below.

(Feature A)

A cross-sectional shape of the conductive layer has a substantial trapezoid shape, and the base angle θ is equal to or greater than 50° and is smaller than or equal to 80°.

(Feature B)

The magnetic layers comprise "gaps (vertical direction gaps CK), extending so as to have a component along (or in) the direction of layering of the layered body (in the direction of the thickness of the conductive layer) and connects/communicates between two conductive layers adjacent to each other in the direction of layering".

(Feature C)

Figure 28:
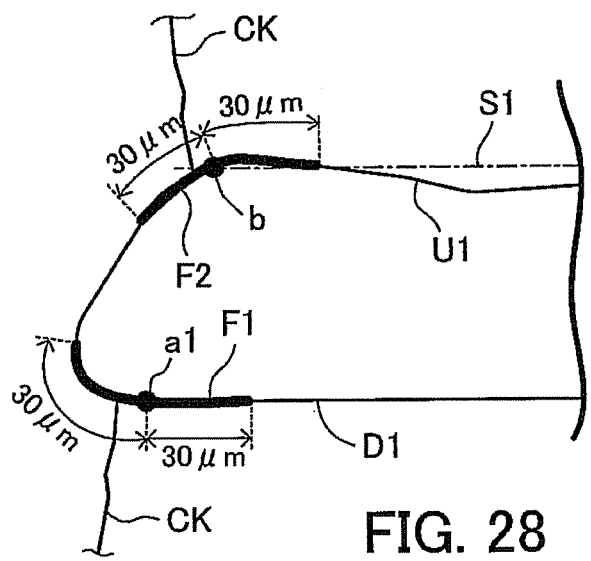
FIG. 28 is a partial vertical cross-sectional view of a conductive layer (coil portion), according to an example of the present invention.

The vertical direction gap CK extends downwardly, in a cross sectional view of the coil portion (i.e., in a cross sectional view of the conductive layer and the magnetic layer, cut by a plane perpendicular to the longitudinal direction of the conductive layer), so as to have "the component along (or in) the direction of layering of the layered body", the gap extending from "a surface of the conductive layer within ±30 μm (refer to a heavy line F1 shown in FIG. 28) along the surface of the conductive layer from one of end portions (e.g., points a1 shown in FIGS. 23 to 26) of the lower base D1 of the conductive layer". Further, the vertical direction gap CK extends upwardly so as to have "the component along (or in) the direction of layering of the layered body" from "a surface of the conductive layer "within ±30 μm (refer to a heavy line F2 shown in FIG. 28) along the surface of the conductive layer from one of end portions (e.g., the point b or the point b1 shown in FIGS. 23 to 26) of the upper base U1 of the conductive layer".

(Feature D)

The conductive layer has a lot of (a great number of) holes/pores inside, and "a ratio of (total) area of the pores to the area of the conductive layer" in the cross sectional view of the coil portion (i.e., in the cross sectional view of the conductive layer, cut by a plane perpendicular to the longitudinal direction of the conductive layer), is equal to or greater than 2% and is smaller than or equal to than 30%.

(Feature E)

An average of diameters of the pores is equal to or greater than 0.01·t1 and is smaller than or equal to 0.20·t1. That is, the average diameter D satisfies an expression (1) described below.

$$0.01 \leq D/t1 \leq 0.20 \tag{1}$$

(Feature F)

The specific portion of the magnetic layer (the portion of the magnetic layer existing between two conductive layers that are adjacent to each other in the direction of layering) has a relative density which is equal to or greater than 84% and is smaller than or equal to 92%. It should be noted that the relative density is a density of the magnetic layer, the density being 100% when there is no pores in the magnetic layer.

Further, the conductive layer has features as follows.

(Feature G)

The thickness t1 of the conductive layer and the thickness t2 of the specific portion of the magnetic layer satisfy an expression (2) described below.

$$0.1 \leq t2/t1 \leq 0.9 \tag{2}$$

(Feature H)

The length L1 of the lower base is equal to or greater than 200 μm.

Examples of the Present Invention and Comparative Examples

Next will be described various examples (examples 1, 2, and 3) of the layered inductor 10 according to the present invention with comparing them with various comparative examples (comparative examples 1 and 2). It should be noted that the example 1 includes examples 1-1 to 1-5. The comparative example 1 includes comparative examples 1-1 to 1-3. The example 2 includes examples 2-1 to 2-5. The example 3 includes examples 3-1 to 3-7. The comparative example 2 includes comparative examples 2-1 to 2-6.

Common features between the examples 1, 2, and 3 and the comparative examples 1 and 2 are as follows.

The compositions of ferrite contained in the magnetic layer are $Fe_2O_3$ (47.5 mol %)·NiO (16.3 mol %)·ZnO (27.3 mol %)·CuO (8.7 mol %)·$MnO_2$ (0.2 mol %).

A pattern of the coil portion 30 is as shown in FIG. 1. A number of turns is 7.25.

A volume ratio of additive which is the melamine resin in the conductive paste to silver (Ag) is 31.5%.

Conditions for firing of the examples 1, 2, and 3 and the comparative examples 1 and 2 are as follows.

The example 1: Keep 900° C. for 5 hours. The rate of temperature increase after the degreasing period is shown in Table 1. That is, the temperature is increased rapidly.

The comparative Example 1: Keep 900° C. for 2 hours. The rate of temperature increase after the degreasing period is shown in Table 1. That is, the temperature is increased rapidly.

The example 2: Keep 900° C. for 0.5 to 2 hours. The rate of temperature increase after the degreasing period is shown in Table 1. That is, the temperature is increased rapidly.

The example 3: Keep 850 to 900° C. for 0.5 to 5 hours. The rate of temperature increase after the degreasing period is shown in Table 1. That is, the temperature is increased rapidly.

The comparative Example 2: Keep 850 to 920° C. for 0.5 to 5 hours. The rate of temperature increase after the degreasing period is shown in Table 1. That is, the temperature is increased rapidly. However, the kinds, amounts, and grain diameter of resin powders added to the conductive paste are different from those in the conductive paste according to the present examples.

Measurement results of various values about the thus manufactured layered inductors are shown in Table 3 to Table 7. It should be noted that a percent defective in these Tables is a ratio of the number of inductors whose inductance is equal to or smaller than 0.6 pH to the total number of the inductors. Each of the values in these Tables for each of samples (e.g., the embodiment 1-1) is an average of the values for each of the samples excluding defective samples, among the 30 layered inductors (samples) that are simultaneously manufactured. It should also be noted that the example 1 whose data are shown in Table 3 is the layered inductors having neither the vertical direction gaps nor the side direction gaps (i.e., these gaps are not observed). The example 2 whose data are shown in Table 5 is the layered inductors having the vertical direction gaps but having no side direction gaps.

TABLE 3

| Sample Example 1 | t1 (μm) | t2 (μm) | ratio t2/t1 | pitch t1 + t2 (μm) | L1 (μm) | base angle θ (°) | inductance (μH) | DC resistance (Ω) | percent defective (%) |
| --- | --- | --- | --- | --- | --- | --- | --- | --- | --- |
| Example 1-1 | 51 | 9 | 0.18 | 60 | 281 | 52 | 2.5 | 0.056 | 33 |
| Example 1-2 | 39 | 13 | 0.33 | 52 | 279 | 78 | 2.4 | 0.073 | 26 |
| Example 1-3 | 35 | 15 | 0.43 | 50 | 285 | 73 | 2.9 | 0.081 | 17 |
| Example 1-4 | 50 | 30 | 0.60 | 80 | 208 | 65 | 4.8 | 0.069 | 0 |
| Example 1-5 | 45 | 28 | 0.62 | 73 | 285 | 67 | 3.3 | 0.063 | 0 | t1: thickness of the coil
t2: thickness of the magnetic layer
L1: widh of the coil

TABLE 4

| Sample Comparative Example 1 | t1 (μm) | t2 (μm) | ratio t2/t1 | pitch t1 + t2 (μm) | L1 (μm) | base angle θ (°) | inductance (μH) | DC resistance (Ω) | percent defective (%) |
| --- | --- | --- | --- | --- | --- | --- | --- | --- | --- |
| Com. Ex. 1-1 | 60 | 5 | 0.08 | 65 | 281 | 3 | 2.9 | 0.047 | 97 |
| Com. Ex. 1-2 | 53 | 15 | 0.28 | 68 | 276 | 38 | 3.1 | 0.053 | 53 |
| Com. Ex. 1-3 | 42 | 29 | 0.69 | 71 | 210 | 42 | 4.3 | 0.082 | 20 | t1: thickness of the coil
t2: thickness of the magnetic layer
L1: widh of the coil

TABLE 5

Figure 29:
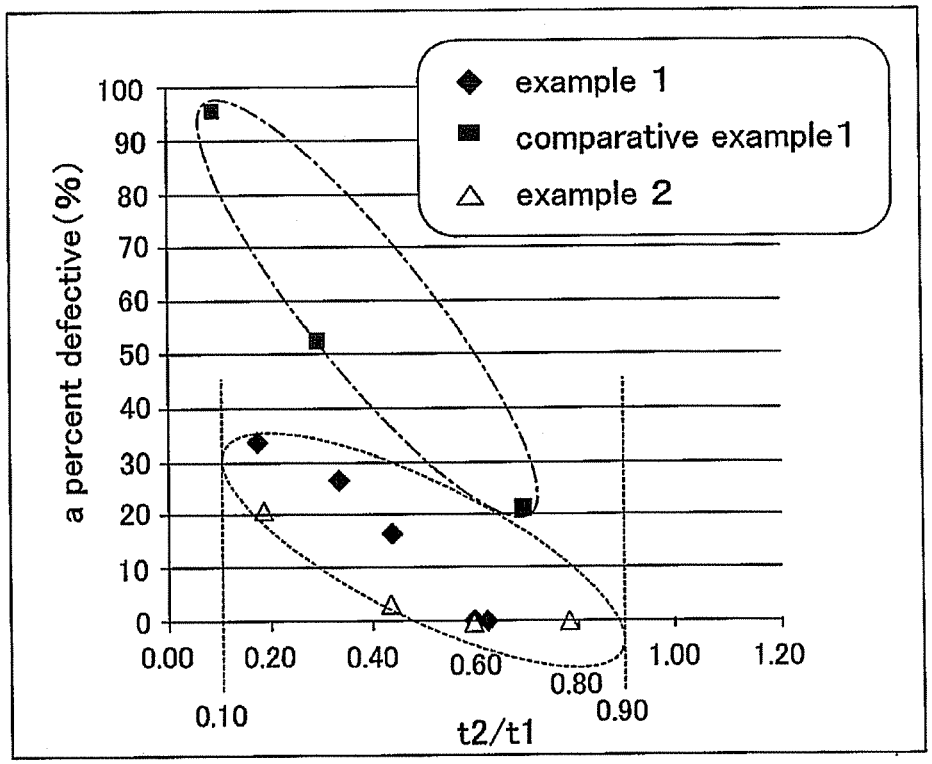
FIG. 29 is a graph showing a relationship between "a ratio of thickness of the coil portion to thickness of a magnetic layer between coils" and "a percent defective"

| Sample Example 2 | t1 (μm) | t2 (μm) | ratio t2/t1 | pitch t1 + t2 (μm) | L1 (μm) | base angle θ (°) | inductance (μH) | DC resistance (Ω) | percent defective (%) |
| --- | --- | --- | --- | --- | --- | --- | --- | --- | --- |
| Example 2-1 | 48 | 9 | 0.19 | 57 | 279 | 55 | 2.3 | 0.059 | 20 |
| Example 2-2 | 47 | 20 | 0.43 | 67 | 280 | 68 | 3.0 | 0.060 | 3 |
| Example 2-3 | 47 | 28 | 0.60 | 75 | 283 | 72 | 3.2 | 0.058 | 0 |
| Example 2-4 | 41 | 32 | 0.78 | 73 | 282 | 63 | 3.3 | 0.062 | 0 |
| Example 2-5 | 41 | 32 | 0.78 | 73 | 283 | 69 | 3.3 | 0.063 | 0 | t1: thickness of the coil
t2: thickness of the magnetic layer
L1: widh of the coil FIG. 29 is a graph showing a relationship between "the ratio t2/t1" and "the percent defective" shown in Table 3 to Table 5. It is clear from FIG. 29 that the percent defective of "the examples 1 and 2 (refer to an ellipse shown by a dashed line) of the present invention, each having the conductive layer whose cross sectional shape is the substantial trapezoid shape, having an upper base and a lower base substantially and having the base angle θ which is equal to or greater than 50° and is smaller than or equal to 80°" is extremely lower than the percent defective of "the comparative example 1 (refer to an ellipse shown by an alternate long and short dash line) having the conductive layer whose cross sectional shape is the semi circular shape, but is not the trapezoid shape". In other words, the percent defective at "the specific rate t2/t1" of the example 1 or the example 2 is much lower than that of the comparative example 1. Accordingly, the inventors found that it is possible to greatly decrease the percent defective, if "the cross sectional shape of the conductive layer is the substantial trapezoid shape, having an upper base and a lower base substantially and having the base angle θ which is equal to or greater than 50° and is smaller than or equal to 80° (preferably the base angle θ being equal to or greater than 52° and smaller than or equal to 78° (refer to the feature A described above). It should be noted that this condition is referred to as "a condition A".

Figure 30:
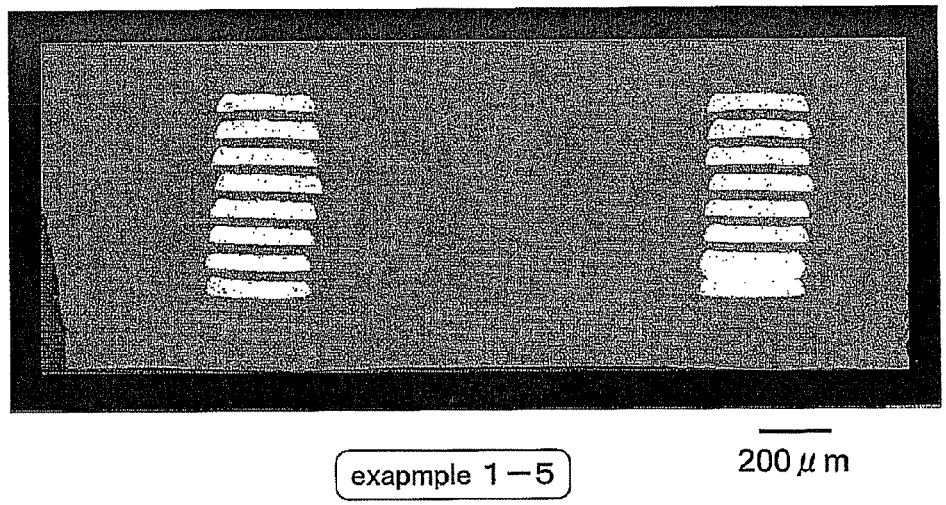
FIG. 30 is a photograph showing a vertical cross section of a layered inductor according to the example of the present invention.
Figure 31:
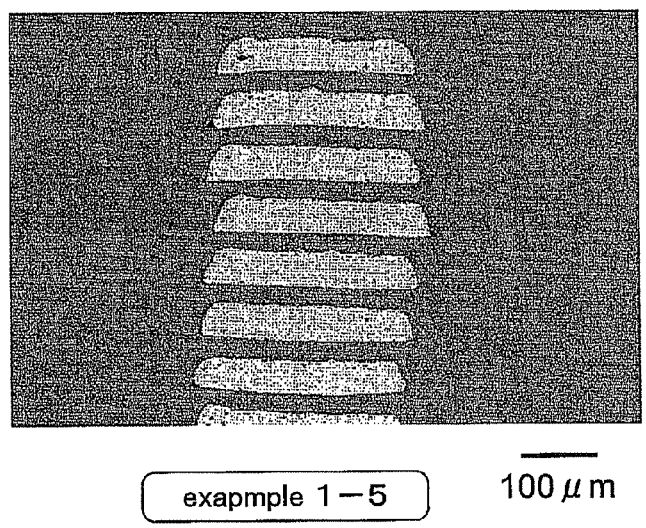
FIG. 31 is a magnified photograph of the vertical cross section of a portion around the coil portion shown in FIG. 30.

FIG. 30 is a photograph showing a vertical cross section of the layered inductor according to the example 1-5 whose data are shown in Table 3. FIG. 31 is a magnified photograph of the vertical cross section of a portion around the coil portion shown in FIG. 30. It is understood from these photographs that there is no gap between the magnetic layer and the conductive layer and there is no structural defect such as a gap (side direction gap) along the direction parallel to the layers (layer planes).

Figure 32:
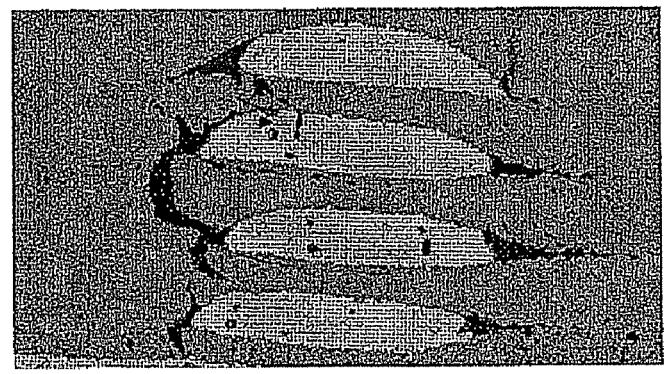
FIG. 32 is a photograph showing a vertical cross section of a layered inductor according to the comparative example.

FIG. 32 is a photograph showing a vertical cross section of the layered inductor of the comparative example 1-3 whose data are shown in Table 4. It is understood from FIG. 32 that the base angle θ of the comparative example 1-3 is 42° which is small, and the shape of the cross section of the coil is not trapezoid (the shape is the substantial semi circular shape). As just described above, if the cross section of the coil is not trapezoid substantially and the base angle θ is smaller than 50°, the gaps occur not only in the vertical direction (in the direction of layering) but also in the side (horizontal) direction (in the direction parallel to the plane of the layer). As a result, the electrical characteristics of the layered inductor become unstable. Further, the side direction gap may cause the delamination and cause a problem in its reliability.

Figure 33:
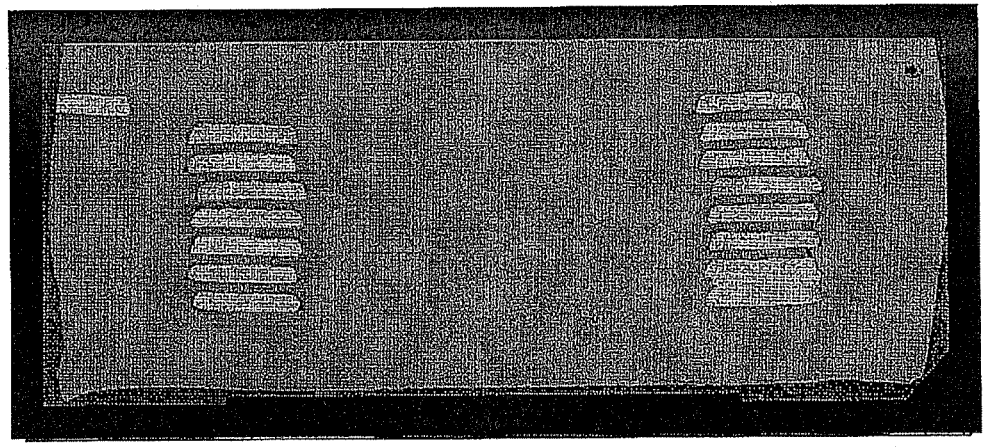
FIG. 33 is a photograph showing a vertical cross section of a layered inductor according to another example of the present invention.
Figure 34:
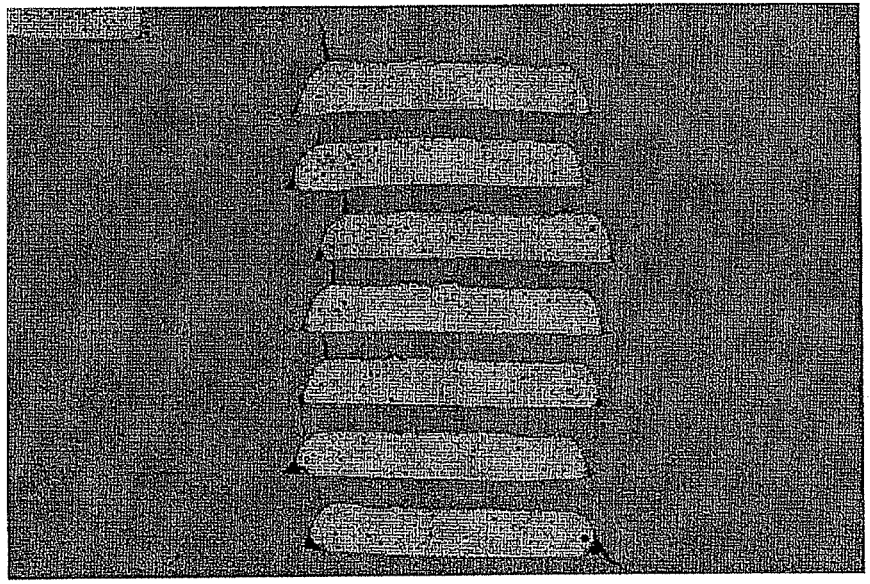
FIG. 34 is a magnified photograph of the vertical cross section of a portion around the coil portion shown in FIG. 33.

FIG. 33 is a photograph showing a vertical cross section of the layered inductor according to the example 2-3 whose data are shown in Table 5. FIG. 34 is a magnified photograph of the vertical cross section of a portion around the coil portion shown in FIG. 33. It is understood from these photographs that the above described vertical direction gaps occur at outer circumference side of the coil portion. It is inferred that this happens because stress concentrates on the end portions of the lower base and the end portions of the upper base by having the shape of the vertical cross section of the coil be substantially trapezoid, and therefore, the vertical direction gaps are formed from those end portions. The vertical direction gaps do not cause the delamination, unlike the side direction gaps, and can release the great internal stress added to the magnetic layer (ferrite). The great internal stress added to the magnetic layer (ferrite) causes a big change in the inductance. Consequently, having such vertical direction gaps occur positively can allow the inductance to be a value close to the desired and targeted value stably.

In view of the above, the inventors found that it is possible to obtain layered inductors whose electrical characteristics such as the inductance are more stable, if the conditions B and C described below are also satisfied.

(Condition B)

The magnetic layer comprises the vertical direction gaps CK (refer to the above Feature B). It is preferable that the vertical direction gap CK extend so as to connect/communicate between two conductive layers adjacent to each other in the direction of layering.

(Condition C)

It is preferable that the vertical direction gap CK extend downwardly, in a cross sectional view of the coil, so as to have "the component along (or in) the direction of layering" from "the surface of the conductive layer within ±30 μm (refer to the heavy line F1 shown in FIG. 28) along the surface of the conductive layer from the end portions of the lower base D1 of the conductive layer" (refer to the above Feature C). Further, It is preferable that the vertical direction gap CK extend upwardly, in a cross sectional view of the coil, so as to have "the component along (or in) the direction of layering" from "the surface of the conductive layer within ±30 μm (refer to the heavy line F2 shown in FIG. 28) along the surface of the conductive layer from end portions of the upper base U1 of the conductive layer" (refer to the above Feature C).

TABLE 6

| Sample Example 3 | t1 (μm) | t2 (μm) | ratio t2/t1 | pitch t1 + t2 (μm) | L1 (μm) | base angle θ (°) | Area ratio of holes (%) | Average diameter of the holes D(μm) | ratio D/t1 | relative density of ferrite (%) | A (μH) | B (Ω) | C (%) |
|---|---|---|---|---|---|---|---|---|---|---|---|---|---|
| Example 3-1 | 49 | 31 | 0.63 | 80 | 284 | 70 | 2.9 | 0.6 | 0.01 | 84 | 3.5 | 0.057 | 0 |
| Example 3-2 | 41 | 32 | 0.78 | 73 | 283 | 69 | 4.5 | 2.6 | 0.06 | 86 | 3.3 | 0.063 | 0 |
| Example 3-3 | 45 | 28 | 0.62 | 73 | 285 | 67 | 8.7 | 1.5 | 0.03 | 92 | 3.3 | 0.063 | 0 |
| Example 3-4 | 47 | 28 | 0.60 | 75 | 283 | 72 | 5.9 | 2.6 | 0.06 | 88 | 3.2 | 0.058 | 0 |
| Example 3-5 | 41 | 32 | 0.78 | 73 | 282 | 63 | 18.8 | 5.0 | 0.12 | 89 | 3.3 | 0.062 | 0 |
| Example 3-6 | 50 | 30 | 0.60 | 80 | 208 | 65 | 22.1 | 8.6 | 0.19 | 91 | 4.8 | 0.069 | 0 |
| Example 3-7 | 45 | 30 | 0.67 | 75 | 281 | 64 | 28.3 | 7.9 | 0.18 | 88 | 3.2 | 0.078 | 0 | t1: thickness of the coil
t2: thickness of the magnetic layer
L1: widh of the coil
A: Inductance
B: DC resistance
C: percent defective Among the samples shown in Table 6, none of the vertical direction gap is observed in any of the examples 3-1, 3-3, and 3-6, and the vertical direction gaps are observed in the examples 3-2, 3-4, 3-5, and 3-7. None of the side direction gaps is observed in any of the examples 3-1 to 3-7.

inventors found that it is possible to obtain layered inductors with extremely high reliability, if the conditions D and E described below are satisfied, based on the careful comparison of values shown in Table 6 to Table 7.

TABLE 7

Figure 35:
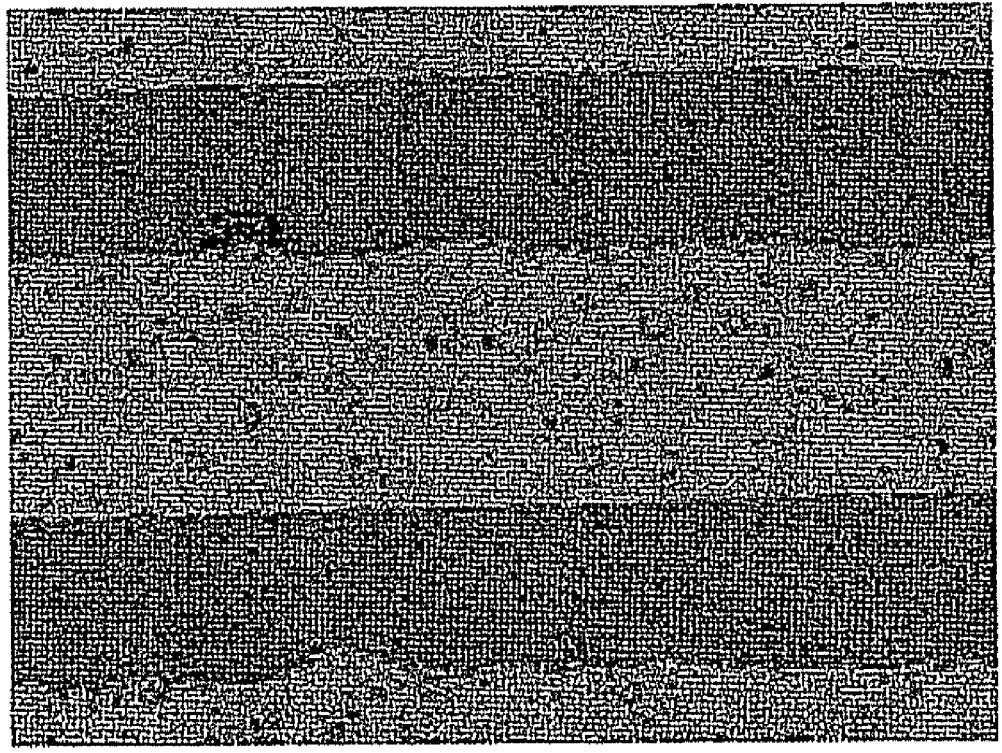
FIG. 35 is a photograph showing a vertical cross section of a layered inductor according to another example of the present invention.
Figure 36:
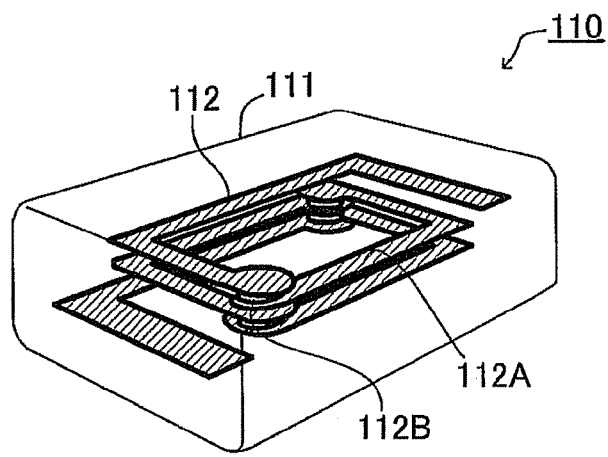
FIG. 36 is a perspective view of a conventional layered inductor.
Figure 37:
Figure 38:
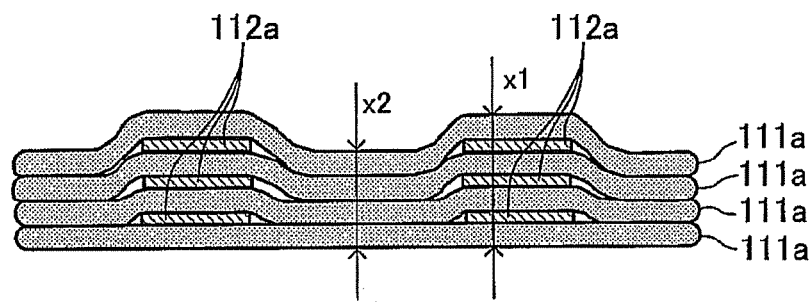
FIG. 38 is a cross-sectional view of a layered body obtained by layering the sheets shown in FIG. 37.

| Sample Comparative Example 2 | t1 (μm) | t2 (μm) | ratio t2/t1 | pitch t1 + t2 (μm) | L1 (μm) | base angle θ (°) | Area ratio of holes (%) | Average diameter of the holes D(μm) | ratio D/t1 | relative density of ferrite (%) | A (μH) | B (Ω) | C (%) |
|---|---|---|---|---|---|---|---|---|---|---|---|---|---|
| Com. Ex. 2-1 | 41 | 30 | 0.73 | 71 | 280 | 64 | 1.2 | 1.6 | 0.04 | 92 | 2.9 | 0.064 | 73 |
| Com. Ex. 2-2 | 43 | 32 | 0.74 | 75 | 281 | 72 | 35.4 | 13.9 | 0.19 | 89 | 3.1 | 0.111 | 0 |
| Com. Ex. 2-3 | 47 | 31 | 0.66 | 78 | 282 | 68 | 3.2 | 0.4 | 0.009 | 91 | 2.7 | 0.066 | 63 |
| Com. Ex. 2-4 | 46 | 32 | 0.70 | 78 | 278 | 63 | 8.7 | 9.7 | 0.21 | 92 | 3.2 | 0.063 | 37 |
| Com. Ex. 2-5 | 48 | 30 | 0.63 | 78 | 280 | 79 | 2.8 | 1.3 | 0.03 | 80 | 3.8 | 0.055 | 0 |
| Com. Ex. 2-6 | 49 | 30 | 0.61 | 79 | 283 | 66 | 7.8 | 4.9 | 0.10 | 94 | 3.1 | 0.063 | 0 | t1: thickness of the coil
t2: thickness of the magnetic layer
L1: widh of the coil
A: Inductance
B: DC resistance
C: percent defective FIG. 35 is a photograph showing a vertical cross section of the layered inductor according to the example 3-3, whose data are shown in Table 6. In this photograph, a light gray portion shows the coil portion, and a dark gray portion shows the magnetic layers. When focusing on the coil portion, circular pores are observed. An average diameter of the pores is the average diameter D of the pores shown in Tables 6 and 7. The area ratio of the pores shown in Tables 6 and 7 is a ratio of an area of the pores to a cross-sectional area of the coil, in the cross-sectional view of the coil.

Findings are obtained from the samples whose data are shown in Table 7 as follows.

The comparative Example 2-1: There are little pores and the delamination occurred.

The comparative Example 2-2: The side direction gap is not observed, however, the DC resistance is extremely large compared to the example 3.

The comparative Example 2-3: There are some pores, however, the average diameter (D) of the pores is too small, and the delamination therefore occurred.

The comparative Example 2-4: Since the average diameter (D) of the pores is too large, the position of the gaps could not be controlled, and random gaps are therefore observed.

The comparative Example 2-5: The gaps are not observed, however, the reliability is low, because the inductance varied more than 20% in a reliability test (a high-temperature and loading test: the inductor is operated at 80° C. for 500 hours with 2 A, and a high-humidity and loading test: the inductor is operated at 40° C., at humidity 95%, for 500 hours with 2 A).

The comparative Example 2-6: The gaps extend up to outer surfaces of the inductor, and the reliability is low, because the inductance varied more than 20% in a reliability test (a high-temperature and loading test: the inductor is operated at 80° C. for 500 hours with 2 A, and a high-humidity and loading test: the inductor is operated at 40° C., at humidity 95%, for 500 hours with 2 A).

Based on a comparison between Table 6 and Table 7, it turned out that the percent defective of the any of the samples in the example 3 is "0%", however, there are samples in the comparative example 2 which have high percent defective. Further, there is no desirable inductor in the comparative example 2 as the findings described above. Accordingly, the (Condition D)

It is preferable that "the ratio (the area ratio of the pores) of the area of the pores to the area of the conductive layer" in the cross-sectional view of the coil be equal to or greater than 2% and be smaller than or equal to 30% (refer to the above Feature D). It is more preferable that "the ratio of the area of the pores to the area of the conductive layer" be equal to or greater than 2.9% and be smaller than or equal to 28.3%. This is because, if the area ratio of the pores is smaller than 2%, a hardness of the coil portion is so high that the stress can not be concentrated on the end portions of the upper base and the lower base of the coil portion, and accordingly, the large side direction gaps occur in the magnetic layers, and thereby, the inductance can not be a value in proximity to the desired and targeted value. On the other hand, if the area ratio of the pores is greater than 30%, the cross-sectional area of the coil portion is excessively small, and accordingly, the resistance of the coil portion becomes excessively large.

(Condition E)

It is preferable that the average diameter D of the pores be equal to or greater than 0.01·t1 and be smaller than or equal to 0.20·t1. In other words, it is preferable that the ratio D/t1 be equal to or greater than 0.01 and be smaller than or equal to 0.20 (refer to the above Feature E). It is more preferable that the average diameter D of the pores of the conductive layers be equal to or greater than 0.01·t1 and be smaller than or equal to 0.19·t1. This is because the stress can be concentrate more easily on the end portions of the upper base and the lower base of the coil portion, when the relatively small pores satisfying the above condition are dispersed in the coil portion.

(Condition F)

It is preferable that the relative density of the specific portion of the magnetic layer (the portion of the magnetic layer existing between two conductive layers that are adjacent to each other in the direction of layering) be equal to or greater than 84% and be smaller than or equal to 92% (refer to the above Feature F). In other words, it is preferable that a porosity in the specific portion of the magnetic layer be equal to or greater than 8% and be smaller than or equal to 16%. This is because, if the relative density is smaller than 84%, a hygroscopicity of the magnetic layer is so high that the reliability of the layered inductor becomes low. On the other hand, if the relative density is greater than 92%, uncontrollable side direction gaps occur in the magnetic layers.

It should be noted that the example 3 (the examples 3-1 to 3-7) satisfies all of the conditions D, E, and F. To the contrary, the comparative example 2 (the comparative examples 2-1 to 2-6) does not satisfy at least one of the conditions D, E, and F.

Further, two groups of conditions consisting of "the condition A" and "the conditions B and C" may preferably be satisfied simultaneously, however, it is sufficient that the only "the conditions A" is satisfied. In addition, it is preferable that "the conditions D and E" among "the conditions D, E, and F" be simultaneously satisfied, and is more preferable that those three conditions D, E, and F be simultaneously satisfied. When those conditions or the groups of conditions are satisfied as described above, the layered inductor, having little problems due to the structural defects etc., compared to the conventional layered inductor, is provided.

Furthermore, it is understood from Tables 3 to 5, that conditions G and H described below are preferably satisfied.

(Condition G)

A ratio $t2/t1$ is equal to or greater than 0.1 and is smaller than or equal to 0.9 (refer to the above formula (2) of the Feature G). It is more preferable that the ratio $t2/t1$ be equal to or greater than 0.18 and equal to or smaller than 0.78.

More specifically, when the ratio $t2/t1$ is equal to or greater than 0.57 (preferably 0.60), the percent defective is "0" in both the example 1 and the example 2. That is, if the ratio $t2/t1$ is equal to or greater than 0.57 (preferably 0.60), no defective inductor is manufactured as long as the cross-sectional shape has the substantial trapezoid shape described above, irrespective of existence or nonexistence of the vertical direction gap (regardless of whether or not the inductor has the vertical direction gap). Further, it is understood from FIG. 29, that the percent defective of the example 2 having the vertical direction gap (gaps) is lower than the percent defective of the example 1 having no vertical direction gap, when the ratio $t2/t1$ is smaller than 0.57 (preferably 0.60). In other words, when the ratio $t2/t1$ is smaller than 0.57 (preferably 0.60), the vertical gap(s) can decrease the percent defective.

(Condition H)

It is preferable that the length L1 of the lower base be equal to or greater than 200 μm (refer to the above Feature H). It is more preferable that the length L1 of the lower base be equal to or greater than 208 μm.

As described above, the embodiments of the present invention can provide the layered inductor, which has no structural defect, such as the delamination, adversely affects the electrical characteristics of the inductor, and which can decrease the resistance of the coil portion by increasing the cross-sectional are of the coil portion. It should be noted that the present invention is not limited to the above embodiments, but may be modified as appropriate without departing from the scope of the invention. For example, a pattern of turn of the coil may be circular in plan view, or the number of turns of the coil portion is other than 7.25.

The invention claimed is:

1. A layered inductor comprising a layered body in which unfired silver-based conductive layers and unfired ferrite-based magnetic layers are layered and then simultaneously fired, and in which the conductive layers are via-connected so as to define a helical coil;
    wherein a cross-sectional shape of a surface of each of said conductive layers, cut by a plane perpendicular to a longitudinal direction of each of said conductive layers, is substantially a trapezoid shape and a lower base;
    wherein a base angle θ of said trapezoid shape at both end portions of said lower base is equal to or greater than 50° and is smaller than or equal to 80°; and
    wherein one of said magnetic layers has a gap extending so as to have a component along a layering direction of said layered body and so as to connect between two of said conductive layers adjacent to each other in the layering direction.

2. The layered inductor according to claim 1, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and
    wherein a ratio D/t1 of an average diameter D of said pores to a thickness t1 of each of said conductive layers that are fired is equal to or greater than 0.01 and is smaller than or equal to 0.20.

3. The layered inductor according to claim 1, wherein in a cross sectional view of said conductive layers and said magnetic layers, cut by a plane perpendicular to the longitudinal direction of the conductive layers, said gap extends downwardly so as to have said component along said layering direction of said layered body, from a surface of one of said conductive layers within ±30 μm along the surface of said one of the conductive layers from one of end portions of said lower base of said one of the conductive layers, and extends upwardly so as to have said component along the layering direction, from a surface of one of said conductive layers within ±30 μm along the surface of said one of the conductive layers from one of end portions of said upper base of said one of the conductive layers.

4. A layered inductor comprising a layered body in which unfired silver-based conductive layers and unfired ferrite-based magnetic layers are layered and then simultaneously fired, and in which the conductive layers are via-connected so as to define a helical coil;
    wherein a cross-sectional shape of a surface of each of said conductive layers, cut by a plane perpendicular to a longitudinal direction of each of said conductive layers, is substantially a trapezoid shape having an upper base and a lower base;
    wherein a base angle θ of said trapezoid shape at both end portions of said lower base is equal to or greater than 50° and is smaller than or equal to 80°;
    wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and
    wherein a ratio D/t1 of an average diameter D of said pores to a thickness t1 of each of said conductive layers is equal to or greater than 0.01 and is smaller than or equal to 0.20.

5. The layered inductor according to claim 4, wherein a relative density of a portion of said magnetic layers existing between two of said conductive layers that are adjacent to each other in a layering direction, is equal to or greater than 84% and is smaller than or equal to 92%, wherein said relative density is 100% when it is assumed that there are no pores in said magnetic layers.

6. The layered inductor according to claim 3, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and wherein a ratio D/t1 of an average diameter D of said pores to a thickness t1 of each of said conductive layers that are fired is equal to or greater than 0.01 and is smaller than or equal to 0.20.

7. A layered inductor comprising a layered body in which unfired silver-based conductive layers and unfired ferrite-based magnetic layers are alternately stacked and simultaneously fired, and in which the conductive layers are via-connected so as to form a helical coil;

wherein an axis of said helical coil extends in a layering direction of said layered body;

wherein a cross-sectional shape of a surface of each of said conductive layers, cut by a plane perpendicular to a longitudinal direction of each of said conductive layers, is substantially a trapezoid shape having an upper base and a lower base; and wherein a base angle θ of said trapezoid shape at both end portions of said lower base is equal to or greater than 50° and is smaller than or equal to 80°.

8. The layered inductor according to claim 7, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and wherein a ratio D/t1 of an average diameter D of said pores to a thickness t1 of each of said conductive layers is equal to or greater than 0.01 and is smaller than or equal to 0.20.

9. The layered inductor according to claim 8, wherein a relative density of a portion of said magnetic layers existing between two of said conductive layers that are adjacent to each other in a layering direction, is equal to or greater than 84% and is smaller than or equal to 92%, wherein said relative density is 100% when it is assumed that there are no pores in said magnetic layers.

10. The layered inductor according to claim 7, wherein one of said magnetic layers has a gap extending so as to have a component along a layering direction of said layered body and so as to connect between two of said conductive layers adjacent to each other in the layering direction.

11. The layered inductor according to claim 10, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and wherein a ratio D/t1 of an average diameter D of said pores to a thickness t1 of each of said conductive layers that are fired is equal to or greater than 0.01 and is smaller than or equal to 0.20.

12. The layered inductor according to claim 10, wherein in a cross-sectional view of said conductive layers and said magnetic layers, cut by a plane perpendicular to the longitudinal direction of the conductive layers, said gap extends downwardly so as to have said component along said layering direction of said layered body, from a surface of one of said conductive layers within ±30 μm along the surface of said one of the conductive layers from one of end portions of said lower base of said one of the conductive layers, and extends upwardly so as to have said component along the layering direction, from a surface of one of said conductive layers within ±30 μm along the surface of said one of the conductive layers from one of end portions of said upper base of said one of the conductive layers.

13. The layered inductor according to claim 12, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and wherein a ratio D/t1 of an average diameter D of said pores to a thickness t1 of each of said conductive layers that are fired is equal to or greater than 0.01 and is smaller than or equal to 0.20.

14. A layered inductor comprising a layered body in which a plurality of first sheets, each of said first sheets including an unfired silver-based conductive layer, and a plurality of second sheets being unfired ferrite-based magnetic layers, are alternately stacked and simultaneously fired, and wherein the conductive layers of the respective first sheets are via-connected to define a helical coil;

wherein each of said first sheets includes another unfired ferrite-based magnetic layer in which said unfired silver-based conductive layer is buried, wherein said unfired silver-based conductive layer is exposed at a bottom surface of each of said first sheets;

wherein an axis of said helical coil extends in a layering direction of said layered body;

wherein a cross-sectional shape of a surface of each of said conductive layers, cut by a plane perpendicular to a longitudinal direction of each of said conductive layers, is substantially a trapezoid shape having an upper base and a lower base; and wherein a base angle θ of said trapezoid shape at both end portions of said lower base is equal to or greater than 50° and is smaller than or equal to 80°.

15. The layered inductor according to claim 14, wherein one of said magnetic layers has a gap extending so as to have a component along a layering direction of said layered body and so as to connect between two of said conductive layers adjacent to each other in the layering direction.

16. The layered inductor according to claim 15, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and wherein a ratio D/t1 of an average diameter D of said pores to a thickness t1 of each of said conductive layers that are fired is equal to or greater than 0.01 and is smaller than or equal to 0.20.

17. The layered inductor according to claim 15, wherein in a cross-sectional view of said conductive layers and said magnetic layers, cut by a plane perpendicular to the longitudinal direction of the conductive layers, said gap extends downwardly so as to have said component along said layering direction of said layered body, from a surface of one of said conductive layers within ±30 μm along the surface of said one of the conductive layers from one of end portions of said lower base of said one of the conductive layers, and extends upwardly so as to have said component along the layering direction, from a surface of one of said conductive layers within ±30 μm along the surface of said one of the conductive layers from one of end portions of said upper base of said one of the conductive layers.

18. The layered inductor according to claim 17, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and wherein a ratio $D/t1$ of an average diameter D of said pores to a thickness $t1$ of each of said conductive layers that are fired is equal to or greater than 0.01 and is smaller than or equal to 0.20.

19. The layered inductor according to claim 14, wherein said conductive layers have a great number of pores, and a ratio of a total area of the pores to an area of said conductive layer in a cross sectional view of said conductive layers, cut by a plane perpendicular to said longitudinal direction of said conductive layers, is equal to or greater than 2% and is smaller than or equal to 30%; and wherein a ratio $D/t1$ of an average diameter D of said pores to a thickness $t1$ of each of said conductive layers is equal to or greater than 0.01 and is smaller than or equal to 0.20.

20. The layered inductor according to claim 19, wherein a relative density of a portion of said magnetic layers existing between two of said conductive layers that are adjacent to each other in a layering direction, is equal to or greater than 84% and is smaller than or equal to 92%, wherein said relative density is 100% when it is assumed that there are no pores in said magnetic layers.

\* \* \* \* \*